(12) United States Patent
Yonker et al.

(10) Patent No.: US 7,402,517 B2
(45) Date of Patent: Jul. 22, 2008

(54) METHOD AND APPARATUS FOR SELECTIVE DEPOSITION OF MATERIALS TO SURFACES AND SUBSTRATES

(75) Inventors: Clement R. Yonker, Kennewick, WA (US); Dean W. Matson, Kennewick, WA (US); Daniel J. Gaspar, Richland, WA (US); George S. Deverman, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 390 days.

(21) Appl. No.: 11/096,346

(22) Filed: Mar. 31, 2005

(65) Prior Publication Data

US 2006/0223312 A1    Oct. 5, 2006

(51) Int. Cl.
*H01L 21/445* (2006.01)
(52) U.S. Cl. .................. 438/674; 438/675; 438/799; 257/E21.586
(58) Field of Classification Search .................. 438/799
See application file for complete search history.

(56) References Cited

U.S. PATENT DOCUMENTS

| | | | | |
|---|---|---|---|---|
| 4,670,086 | A * | 6/1987 | Leamy | ........................ 438/413 |
| 4,734,227 | A | 3/1988 | Smith | |
| 6,429,152 | B1 * | 8/2002 | Yang et al. | .................. 438/798 |
| 6,689,700 | B1 | 2/2004 | Watkins et al. | |
| 6,905,541 | B2 * | 6/2005 | Chen et al. | ..................... 117/86 |
| 2003/0161954 | A1 | 8/2003 | Blackburn et al. | |
| 2003/0183938 | A1 | 10/2003 | Wai et al. | |
| 2004/0120870 | A1 * | 6/2004 | Blackburn et al. | .......... 422/189 |

FOREIGN PATENT DOCUMENTS

WO    0132951 A    5/2001

OTHER PUBLICATIONS

David G. Cahill, et al., Thermal conductivity of sputtered & evaporated SIO2 and TIO2 optical coatings, Appl. Phys. Lett. 65 (3) Jul. 18, 1994, pp. 309-311.

Delan, et al., Thermal Conductivity Measurement of Thin Dielectric Films Using the 3w Technique, pp. 49-50, Mar. 2003.

(Continued)

*Primary Examiner*—Stephen W. Smoot
(74) *Attorney, Agent, or Firm*—James D. Matheson

(57) ABSTRACT

Methods are disclosed for depositing materials selectively and controllably from liquid, near-critical, and/or supercritical fluids to a substrate or surface controlling the location and/or thickness of material(s) deposited to the surface or substrate. In one exemplary process, metals are deposited selectively filling feature patterns (e.g., vias) of substrates. The process can be further used to control deposition of materials on sub-surfaces of composite or structured silicon wafers, e.g., for the deposition of barrier films on silicon wafer surfaces. Materials include, but are not limited to, overburden materials, metals, non-metals, layered materials, organics, polymers, and semiconductor materials. The instant invention finds application in such commercial processes as semiconductor chip manufacturing. In particular, selective deposition is envisioned to provide alternatives to, or decrease need for, such processes as Chemical Mechanical Planarization of silicon surfaces in semiconductor chip manufacturing due to selective filling and/or coating of pattern features with metals deposited from liquid, near-critical, or supercritical fluids.

54 Claims, 10 Drawing Sheets

OTHER PUBLICATIONS

David G. Cahill, Thermal conductivity measurement from 30 to 750 K: the 3w method, Rev. Sci. Instrum. 61 (2), Feb. 1990, pp. 802-808.

Becker, et al., Highly Conformal Thin Films of Tungsten Nitride Prepared by Atomic Layer Deposition from a Novel Precursor, Chem. Mater., vol. 15, No. 15, 2003, pp. 2969-2976.

Delan, et al., Thermal Conductivity Measurement of Thin Dielectric Films Using the 3w Technique, pp. 49-50.

PCT International Search report and Written Opinion, Nov. 2007.

O.A. Louchev et al., The morphological stability in supercritical fluid chemical deposition of films near the critical point, Journal of Crystal growth, No. 155, 1995, pp. 276-285 (XP002457043).

* cited by examiner

METHOD AND APPARATUS FOR SELECTIVE DEPOSITION OF MATERIALS TO SURFACES AND SUBSTRATES

FIELD OF THE INVENTION

The present invention relates generally to a method and an apparatus for selective deposition of materials. More particularly, the invention relates to a method and an apparatus for selectively depositing materials to a surface or substrate thereby controlling thickness of the material deposited at, on, in, and/or along the surface or substrate. The instant invention finds application in such commercial processes as semiconductor chip manufacturing.

BACKGROUND OF THE INVENTION

Semiconductor chips used in a multitude of electronic devices are structured or composite substrates fabricated from materials including semiconductors, dielectrics, metals, metal oxides, and patterned films comprising these materials. For example, the critical circuitry and interconnects on semiconductor chips require deposition of metals including, but not limited to, copper, aluminum, tungsten, tantalum, and ruthenium in pattern features, e.g., vias and trenches of the chip. The impetus to produce devices with higher component densities, enhanced operating speeds and/or efficiencies means smaller features and/or generally more complex geometries are required. As the footprint of critical feature patterns continues to decrease, efficient, optimum, and/or proper deposition of materials is not guaranteed using standard or established industry deposition technologies. Accordingly, a need exists for processes that selectively deposit materials, e.g., as layers, films (e.g., deposition of barrier films on silicon wafer surfaces for semiconductor chip manufacturing), and fillers or coatings to surfaces, sub-surfaces, feature patterns (e.g., vias), and/or other surfaces having complex geometries, e.g., voids (e.g., three-dimensional voids), and tunnels (e.g., interconnected tunnels).

SUMMARY OF THE INVENTION

The present invention relates generally to a method and apparatus for selective deposition of materials. More particularly, the invention relates to a method and an apparatus for selectively depositing materials to a surface or substrate controlling thickness of material deposited to the surface or substrate.

The term surface as used herein refers to any boundary where selective deposition is desired, including, but not limited to, horizontal surfaces, vertical surfaces, flat surfaces, complex surfaces having various combinations and orientations of two-dimensional and/or three-dimensional surfaces including, but not limited to, feature patterns, voids, tunnels and interconnected tunnels, or the like.

In one aspect, the method of the invention generally comprises providing a substrate composed of at least one material, the substrate including a deposition surface disposed to be heated by a heating source(s); providing a solvent; providing a precursor miscible in and stable at liquid, near-critical, or supercritical conditions for the solvent, the precursor comprising a deposition material releasable at a release temperature or condition for the precursor; exposing the substrate and the precursor in the solvent; heating the substrate generating a temperature gradient at, on, in, through, or along the surface, the surface being at or exceeding the release temperature for the precursor; and whereby the deposition material is released from the precursor and selectively deposited to the surface in response to a temperature established by a temperature gradient thereby controlling the deposition material at, on, in, and/or along the surface. In an embodiment of the method, the surface is horizontal. In another embodiment, the surface is vertical. In yet another embodiment, the surface is a complex geometric surface having multiple deposition surfaces including, but not limited to, horizontal, vertical, flat, and bottom surfaces, or combinations thereof. In yet another embodiment, the surface comprises feature patterns having multiple or complex surfaces. In yet another embodiment, the surface comprises a two-dimensional surface. In yet another embodiment, the surface comprises a three-dimensional surface. In yet another embodiment, the surface comprises micro- and/or nano-scale structures (e.g., dual damscene structures, voids (e.g., three-dimensional voids), tunnels (e.g., interconnected tunnels), or the like. In still yet another embodiment, the surface or substrate comprises tiny mechanical devices (e.g., advanced mems structures, small cantilevers, fans, and/or other similar mechanical devices).

In another aspect, the method of the invention comprises providing a substrate or material having feature patterns and/or a deposition surface disposed to be heated by a heat source(s); providing a precursor comprising a deposition material releasable at a release temperature or condition for the precursor; exposing the substrate or material to a solvent fluid and the precursor at liquid, near-critical, or supercritical conditions for the solvent; heating the substrate with the heating source(s) generating a temperature gradient in the features; whereby the deposition material is released from the precursor at the release temperature or condition for the precursor and selectively deposited in the features and/or on the deposition surface in response to the temperature gradient substantially filling the feature pattern(s) or a portion thereof and/or controlling the thickness of the deposition material in the feature(s) and/or on the deposition surface. In an embodiment of the method, the temperature gradient(s) is fixed in time. In another embodiment of the method, the temperature gradient(s) is variable in time, e.g., changeable as a function of time. In an embodiment, the temperature gradient is generated in conjunction with temperature programming. In an example, temperature(s) in the temperature gradient are programmed to increase over time. In another example, the temperature(s) in the temperature gradient are programmed to decrease over time. In an embodiment of the method, feature patterns are filled with a deposition material from the bottom of the feature(s) to the top of the feature(s) in response to a temperature gradient generated in the features. In another embodiment, feature patterns are coated with a deposition material in response to a temperature gradient generated in the features. In yet another embodiment, a deposition material is selectively deposited to both surfaces and to feature patterns, or portions thereof.

In another aspect, a system of the invention generally comprises a chamber for staging a substrate having a deposition surface; delivery means for delivering a solvent fluid and a precursor miscible in the solvent and optionally a chemical additive or reagent to the substrate at a liquid, near-critical, or supercritical temperature for the solvent; a heating source(s), the surface being disposed in an operable thermal relationship with the heating source(s) for generating a temperature gradient at, in, on, or along the deposition surface of the substrate and releasing a deposition material from the precursor at a release temperature or condition for the substrate; and whereby heating of the substrate at the release temperature releases the deposition material from the precursor selectively depositing the deposition material to the surface in response to the temperature gradient thereby controlling the location and/or thickness of the material deposited to the surface or substrate.

DETAILED DESCRIPTION

Figure 1:
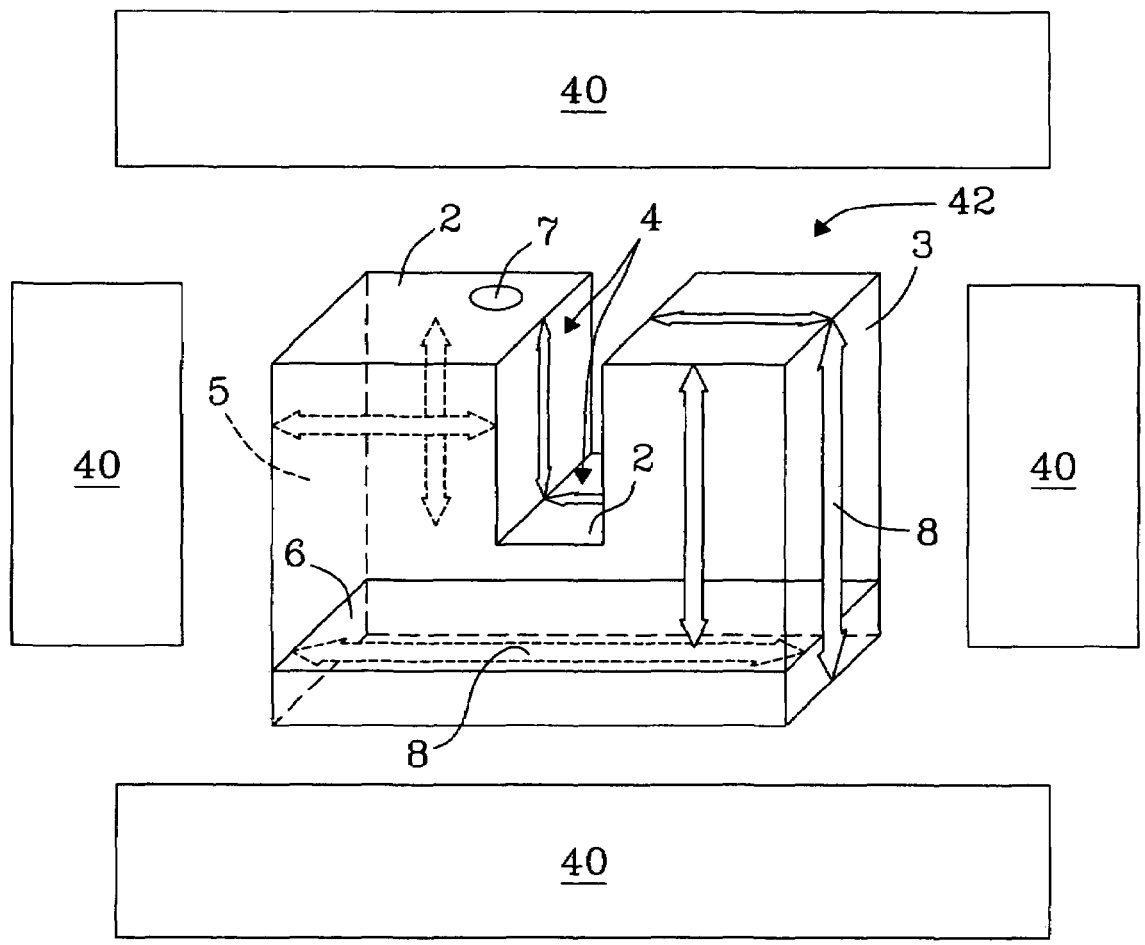
FIG. 1 illustrates various temperature gradients at, in, on, through, or along deposition surfaces, e.g., horizontal surfaces, vertical surfaces, and/or feature pattern surfaces generated in one, two, and three dimensions in conjunction with various heating source(s) for effecting selective deposition.

While the present invention is described herein with reference to method(s), apparatus, system(s), and embodiments thereof, it should be understood that the invention is not limited thereto, and various alternatives in form and detail may be made therein without departing from the spirit and scope of the invention. In particular, those of skill in the art will appreciate that combining, intermixing, and/or applying various fluids, precursors, and/or reagents as described herein may be practiced in various and alternate ways. For example, application of the method and apparatus on a commercial scale may comprise use of high-pressure pumps and pumping systems, various and/or multiple chambers, e.g., for evacuation, rinsing and/or deposition, and/or systems for transferring, moving, transporting, combining, mixing, delivering and/or applying various fluid(s), solvent(s), reagent(s), and/or precursor(s). Associated application and/or processing steps for utilizing the fluids of the present invention or for post-processing collection of waste materials and chemical constituents are also envisioned and encompassed hereby, as would be performed by those of skill in the art.

The rate of heat transfer in a substrate, material, or fluid depends in part on the thermal conductivity of the substrate, material, or fluid. Thermal conductivity ($W \cdot cm^{-1} K^{-1}$) relates the heat flux ($W/m^2$) flowing through a material if a certain temperature gradient ($\Delta T$ per unit distance, e.g., K/m) exists. Selective deposition to a material, surface, or substrate is effected in response to a temperature gradient at, in, on, and/or along the surface where deposition is desired, which in turn is affected by the thermal conductivity of the various fluids, solvents, and/or materials present in the deposition environment. For example, the thermal conductivity of a selected solvent determines its ability to dissipate heat from a surface or a substrate in contact with the solvent and thus the temperature control effected in, e.g., a deposition chamber. Likewise, the thermal conductivity of a material or substrate, e.g., an LKD (insulating) layer of a semiconductor chip substrate or composite wafer, determines, e.g., the energy transport expected through the material(s) of the substrate or wafer. The change in temperature realized through a material ultimately determines the temperature gradient established relative to surfaces (e.g., horizontal or vertical), feature patterns (e.g., via), or otherwise complex surfaces of a substrate or material. Given that temperatures at, in, on, or along a selected deposition area or surface may not be directly measurable, to a first approximation, the temperature gradient may be assumed to be a linear temperature function calculated as the difference in temperature (e.g., $T_1$-$T_2$) between two locations ($L_1$ and $L_2$) divided by the distance between the locations, as shown from equation [1]:

$$\frac{\Delta T}{\Delta L} = \frac{(T_1 - T_2)}{(L_1 - L_2)} \quad [1]$$

For example, a heating source in thermal contact with the bottom of a semiconductor chip or wafer substrate generates a temperature gradient vertically through the substrate between, e.g., the substrate layer in contact with the heating source at a first location $L_1$ and temperature $T_1$ and a layer at a second location $L_2$ and temperature $T_2$, e.g., an external layer distal to the source, the distance between the two locations being given by the difference $L_1$–$L_2$. From this information, the approximate temperature at a desired deposition surface along the temperature gradient may be estimated. Temperatures at selected deposition surfaces in multilayered or composite substrates may be similarly approximated. In but one illustrative example, temperatures measured at a top surface (external) and a bottom surface (external) of a substrate along a vertical temperature gradient generated through the substrate permits the expected temperature drop per unit distance along that gradient to be calculated, from which temperature(s) of any deposition surface (e.g., pattern featured surface) can be estimated. As will be understood by the person of skill in the art, the ability to generate temperature gradients varies as a function of the material, surface, or substrate (e.g., semiconductor chips and wafers), composition of the material or substrate (e.g., metal, nonmetal, polymer), nature of the material or substrate (e.g., homogeneous, heterogeneous, porous, non-porous, insulating, conducting, highly conducting), orientation of deposition surfaces (e.g., angled, vertical, horizontal, flat), and thermal conductivity(s) of selected material(s), reagent(s), fluid(s), and solvent(s) utilized in the deposition environment.

Temperature achieved at a surface due to a temperature gradient generated at, in, on, through, or along a surface will meet or exceed the release temperature for the deposition material precursor, as denoted by the following inequality [2]:

$$T_{surface} \leqq T_{release} \quad [2]$$

where $T_{surface}$ is the temperature at, in, on, or along the deposition surface and $T_{release}$ is the release temperature for the precursor. The term "release temperature" as used herein refers to the temperature at which a deposition material is released from a precursor or is otherwise made available for deposition, e.g., by chemical displacement, dissociation, or thermal decomposition of the precursor. For example, a precursor composed of a polymer is made available ("released") for deposition at a surface when the surface temperature equals or exceeds the polymerization temperature (its "release temperature") of the polymer. In another example, a metal present in an organometallic precursor is made available ("released") for deposition at the dissociation or thermal decomposition temperature for the precursor.

In general, the greater the difference between temperatures $T_1$ and $T_2$, (i.e., $T_1$–$T_2$) in a specified temperature gradient defined at two locations $L_1$ and $L_2$, the better the deposition selectivity (e.g., at a location), thermodynamic and kinetic rates of deposition, and control of film thickness. The person of skill in the art will further understand that temperatures at which deposition occur will vary as a function of the precursors selected. No limitations are hereby intended. All temperature gradients and precursors as will be selected by the person of skill in the art are incorporated herein.

As will be recognized by those of skill in the art, the invention is not limited to chemistries associated with temperature only (e.g., precursors that release deposition materials in response to temperatures). In particular, both deposition and release chemistries are also controlled and/or influenced by such factors as pressure, catalysis, concentration, reaction rates (e.g., decomposition), other rate parameters (e.g., thermodynamic rates, kinetic rates, diffusion rates), and the like, or combinations thereof. Control of material concentration as a deposition parameter, for example, has implications for selective deposition of material(s) related to manufacturing and/or repair of substrates, including, e.g., semiconductor chip substrates and/or devices constructed thereon. For example, manufacture of tiny devices including, e.g., advanced mems structures, small cantilevers, fans, and other similar mechanical devices on or within silicon wafer substrates, can involve selectively removing material(s) (e.g., 3-dimensionally) and selectively depositing with other material(s) (e.g., refilling) in accordance with the present invention. All processes, modalities, and/or parameters generating conditions suitable for selective deposition of materials to substrates and/or surfaces as described herein are within the scope of the present invention. No limitations are hereby intended.

FIG. 1 illustrates a substrate 42 having various and multiple surfaces including, but not limited to horizontal surfaces 2, vertical surfaces 3, feature surfaces 4, external surfaces 5, exposed imbedded surfaces 6, including portions and sections thereof 7. As illustrated in the figure, various temperature gradient(s) 8 can be generated in conjunction with like or different heating source(s) 40 in any orientation or any depth at, in, on, through, or along surfaces of a material or substrate. Heating sources 40 include, but are not limited to, infra-red heating sources, convective heating sources, electrical heating sources, resistive heating sources, ultrasonic heating sources, mechanical heating sources, chemical heating sources, or combinations thereof. Alternatively, substrate 42 may be rotated or oriented such that temperature gradients may be generated at, in, on, through, or along deposition surfaces in conjunction with heating source(s) 40. No limitations are hereby intended.

As will be recognized by the person of skill in the art, temperature gradients will vary in width from narrow to wide encompassing, e.g., a narrow portion 7 or section of a material or alternatively encompassing, e.g., an entire substrate surface or layer. Furthermore, temperature gradients may be generated in one, two, and three dimensions conforming to surfaces, planes, layers, pattern features, and/or other complex structures (e.g., two- and three-dimensional structures (e.g., dual damascene structures) having complex geometries. For example, material deposition can be promoted selectively on a two-dimensional flat surface (e.g., horizontal layers of a semiconductor substrate or composite), or a portion thereof, using temperature gradients generated vertically downward through the surface or layer such that temperature of the deposition surface or a limited portion thereof equals or exceeds the release temperature for the precursor. In another example, a temperature gradient generated through a horizontal two-dimensional surface or layer wherein two temperatures of the temperature gradient are each maintained on the surface, selective deposition can be controlled by manipulation of temperatures therein. Further, temperature gradients may be generated in various materials, substrates, and features (e.g., trenches, wells, vias, and the like), as well as other structures including, but not limited to, voids, tunnels, and interconnected tunnels having complex three dimensional surfaces. In addition, deposition can be selectively directed to a limited location or area of a substrate or surface, including portions thereof, or alternatively cover the entire deposition surface.

The person of skill in the art will further recognize that temperature gradients for selective control of deposition may also be varied in time. For example, temperature gradients may be varied using, e.g., temperature programming. In a static temperature system with static temperature gradients, control of temperatures has no direct effect on deposition thickness. However, when temperatures are manipulated dynamically, e.g., through temperature programming, control of temperatures for various temperature gradients has an effect on deposition thickness. Additionally, quantity of deposition material made available to a system, e.g., by control of precursor or reagent concentration, affects deposition thickness. In an embodiment, temperature(s) for a given temperature gradient may be programmed to decrease, remain constant, or increase for periods that vary in time thereby effecting selective deposition. For example, ramping of surface temperature(s) of a given substrate can be effected by altering temperature of fluid solution(s) in contact with the substrate surface. In yet another embodiment, temperature(s) for a given temperature gradient may be programmed to increase in time, to remain fixed in time, to decrease in time, or to include combinations thereof. No limitations are intended. All temperature variables and/or programming as will be implemented by the person of skill in the art for generation of temperature gradients related to selective deposition are incorporated herein.

In an embodiment of the invention, materials may be selectively deposited to limited areas 7 of a substrate 42 in conjunction with multiple heat sources 40. In but one illustrative example, a first heating source, e.g., a conducting filament, is inserted in a substrate extending through the substrate to an exterior surface. The conducting filament which is in thermal contact with a second heating source generates a temperature gradient through the substrate to the surface along the conducting filament locally heating the external surface of the substrate to a temperature above the release temperature for the precursor, whereby a deposition material is selectively deposited at the point or limited area of localized heating. A system for selective deposition will now be described with reference to FIG. 2.

Figure 2:
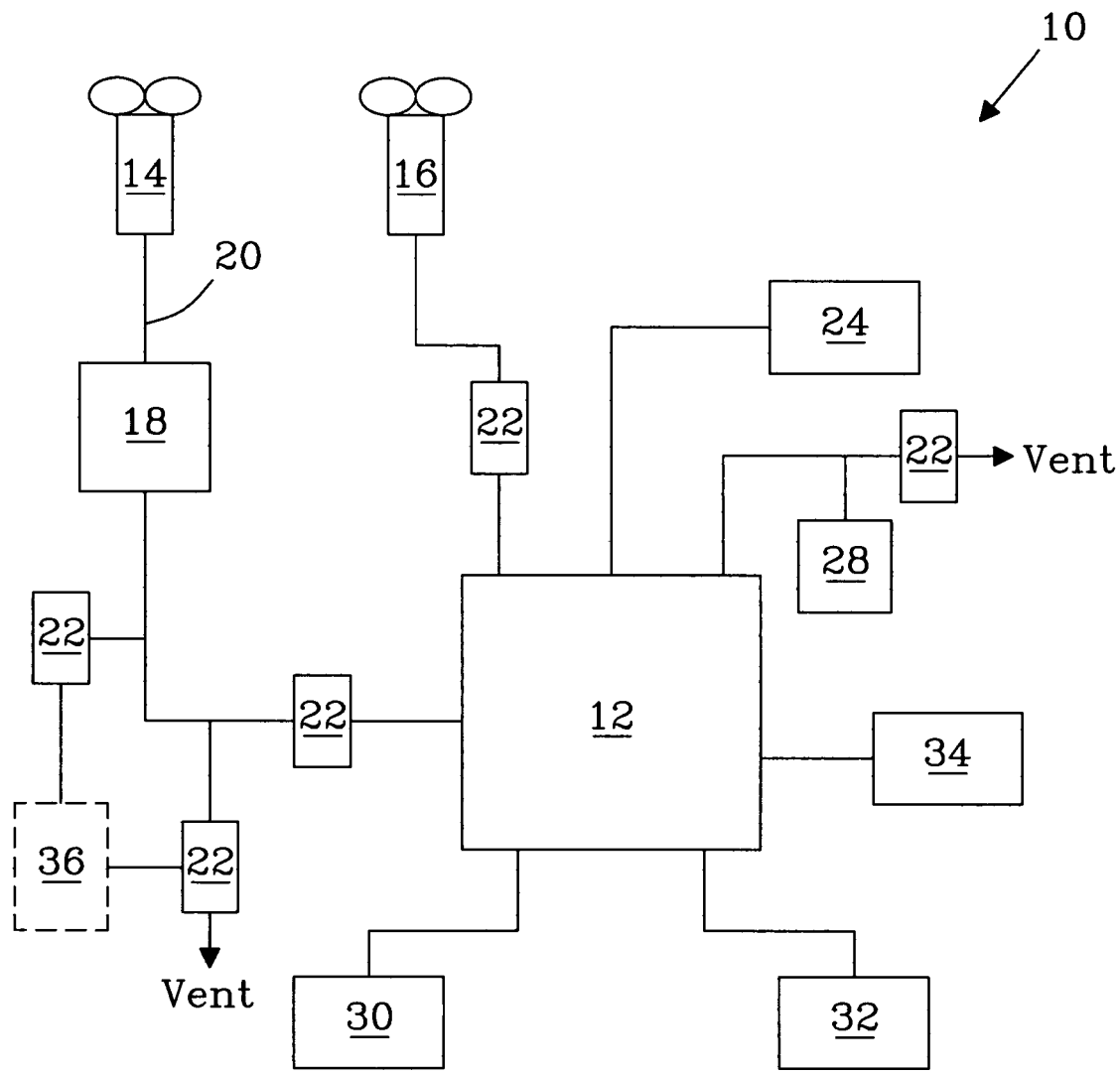
FIG. 2 illustrates a complete system of a bench-top scale design for selectively depositing materials on surfaces, subsurfaces, and/or in pattern features of a substrate.

FIG. 2 illustrates a complete deposition system 10 of a benchtop scale design for practicing the process of the invention, according to an embodiment of the invention. System 10 comprises a deposition vessel 12 for depositing materials selectively on a substrate, e.g., within patterned features of a semiconductor wafer or substrate. Vessel 12 couples to a solvent fluid source 14, e.g., ultra-high-purity $CO_2$, and an optional reagent source 16, e.g., hydrogen (99.5%). Pressure is programmed and maintained in system 10 and vessel 12 by feed pump 18, e.g., a model 260-D microprocessor-controlled syringe pump (ISCO Inc., Lincoln, Nebr.) in fluid connection with solvent source 14. Devices and components comprising system 10 are operatively linked via 0.020-0.030 inch I.D. and $1/16^{th}$-inch O.D. high-pressure liquid chromatography (HPLC) transfer line(s) 20 composed of a high-strength polymer comprising PEEK™ (Upchurch Scientific Inc., Whidbey Island, Wash.) or stainless steel tubing, but is not limited thereto. Solvent fluid is introduced to vessel 12 via a standard valve 22, e.g., a model 15-11AF1 two-way straight valve (High Pressure Equipment Co., Erie, Pa.) or a model 15-15AF1 three-way/two-stem connection valve (High Pressure Equipment Co., Erie, Pa.) or other appropriate valve 22, from transfer line 20 leading from pump 18 to vessel 12. Reagent fluid is introduced to vessel 12 from reagent source 16 through a standard valve 22, e.g., a model 15-11AF1 two-way straight valve (High Pressure Equipment Co., Erie, Pa.). Solvents, reagents, precursors, and/or fluids may be mixed optionally in a premixing cell 36 prior to introduction to vessel 12. A pressure gauge 24, e.g., a Bourdon tube-type Heise gauge (Dresser, Inc., Addison, Tex.) is connected to vessel 12 for measuring pressure in system 10 or alternative pressure readout or display. Vessel 12 is vented to a standard fume hood through a standard valve 22 (e.g., vent valve). Vessel 12 is further coupled to a rupture disk assembly 28, e.g., a model 15-61AF1 safety head (High Pressure Equipment Co., Erie, Pa.) preventing over-pressurization of vessel 12. Vessel 12 is coupled electrically to current source 30 for heating substrates and fluids introduced to vessel 12. Vessel 12 is further linked to cooling source 32, e.g., a circulation bath or a cooling water line, for maintaining temperature in vessel 12. Temperature of vessel 12 is displayed by standard thermocouple temperature display(s) 34.

The person of skill in the art will recognize that equipment is application driven and can be appropriately scaled and configured to address specific applications, industrial requirements, processes, and/or manufacturing purposes without deviating from the spirit and scope of the invention. For example, manufacturing and/or processing of commercial scale (e.g., 300 mm diameter) wafers and semiconductor substrates may incorporate various transfer systems and devices, delivery systems, spraying equipment and/or devices, chambers, computer integration and control, and/or other allied processing systems, devices, and/or equipment components. Thus, no limitation is intended to the bench-scale reaction vessel design described herein. All equipment and components as would be selected by those of skill in the art are hereby incorporated. Components internal to vessel 12 will now be described with reference to FIG. 3.

Figure 3:
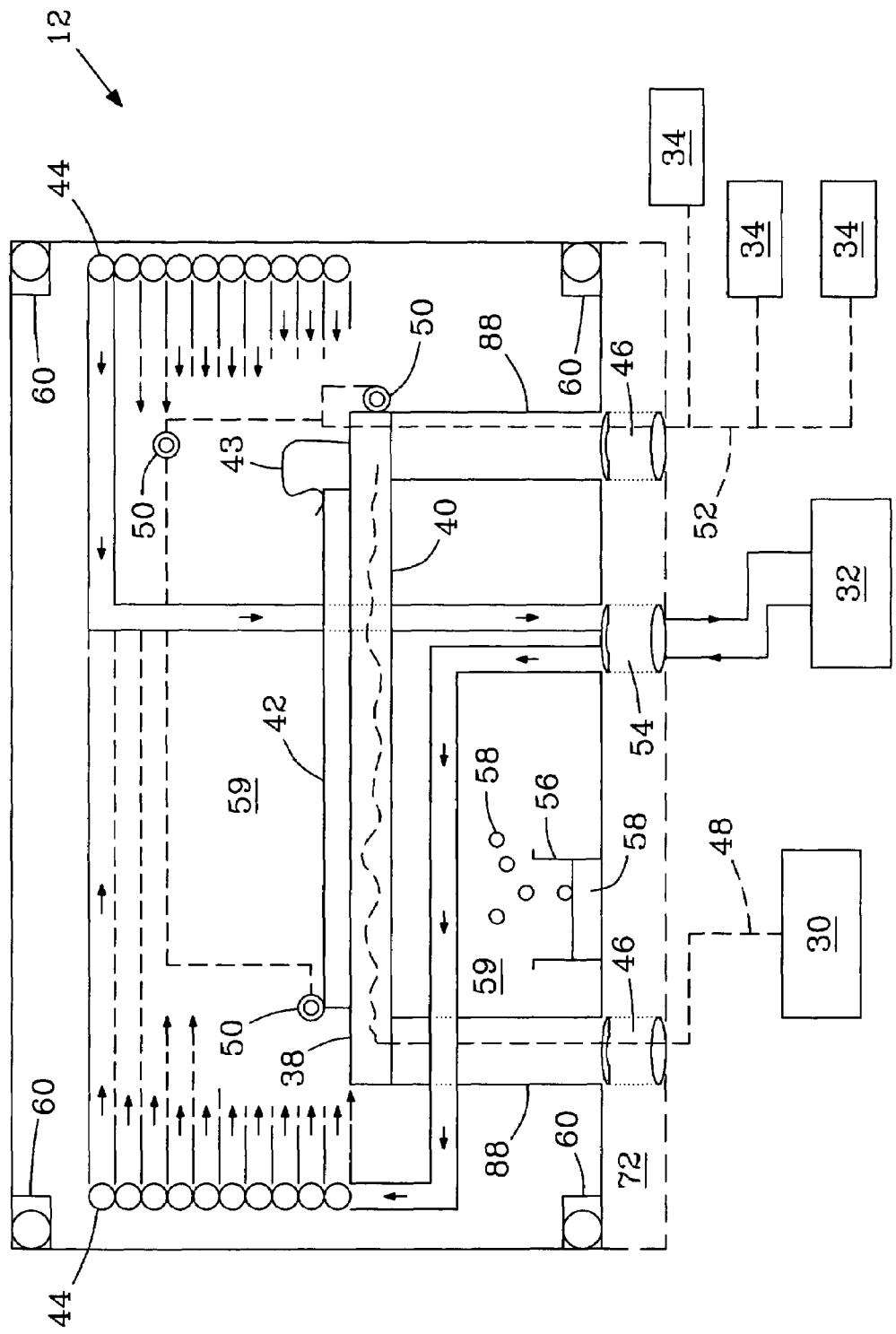
FIG. 3 presents a cross-sectional view of a deposition vessel illustrating components for selectively depositing materials on a surface, a sub-surface, and/or pattern features of a substrate.

FIG. 3 presents a cross-sectional view of a deposition vessel 12 (chamber) for selectively depositing materials to surfaces (e.g., horizontal and/or vertical surfaces), substrates (e.g., semiconductor substrates), pattern features, sub-surfaces, and/or other complex three-dimensional surfaces (e.g., voids, tunnels) according to an embodiment of the invention. Vessel 12 comprises a heating stage 38, e.g., a 25 mm graphite-base boraelectric™ heater (GE Advanced Ceramics, Strongsville, Ohio) mounted to ceramic staging posts (standoffs) with a M-2 (graphite) mounting kit, described further below in reference to FIG. 4c. Heating stage 38 employs an internal heating source 40, e.g., a graphite heater core or resistive heater element, for heating substrate 42 positioned on stage 38. Substrate 42 is held in place on stage 38 by, e.g., a holding clip 43 or other holding means. Heat exchanger 44 comprises a plurality of cooling coils made, e.g., of ⅛ inch O.D. stainless-steel tubing. Coils of exchanger 44 surround heating stage 38 providing temperature control to fluid(s), substrates, or wafer(s) introduced to vessel 12. It will be recognized by those of skill in the art that temperature control (e.g., cooling and/or heating) of vessel 12 may be achieved in various alternate ways using, e.g., cooling towers, chillers, refrigeration units, temperature controllers, thermostats, heat exchangers, or like devices and systems. No limitation is thus intended. In the instant configuration, coils of exchanger 44 couple to cooling source 32 through feedthrough(s) 54 that enters vessel 12 through the bottom vessel section 72, described further below in reference to FIG. 4c. Feedthrough 54 is sealed using ⅛ inch high-pressure fittings (e.g., PEEK fittings from UpChurch Scientific Inc., Whidbey Island, Wash.). Current source 30 for heating stage 38, e.g., a 0-400 VAC variable (variac) transformer (ISE, Inc., Cleveland, Ohio) links to stage 38 via wiring 48 that enters vessel 12 through feedthrough 46 located in bottom vessel section 72. Thermocouples 50, e.g., Type-K thermocouples (Omega, Engineering, Stamford, Conn.) are positioned to measure temperatures in vessel 12, e.g., of heating stage 38, of substrate 42, and/or of solvent fluid 59 (and reagents soluble therein), linking electrically to temperature display devices 34 external to vessel 12 via thermocouple lead wiring 52 that enters vessel 12 through a separate feedthrough 46 located in bottom vessel section 72, but is not restricted thereto. Feedthrough(s) 46 are sealed using high-pressure fitting(s), e.g., stainless steel fittings (CONAX, Buffalo, N.Y.). Other feedthrough(s) or passage means (e.g., conduits) may be provided as necessary for linking devices external to vessel 12. Seal(s) 60 effects a pressure and temperature seal in vessel 12 prior to introduction of fluid constituents. Vessel 12 further comprises an optional holding vessel 56, e.g., a crucible, for dispersing precursor 58 into solvent fluid 59. Precursor 58 may be optionally premixed with solvent and/or other reagents in a premixing cell 36 prior to introduction to vessel 12. Additional components, devices, and instruments may be employed without reservation, e.g., for data collection/measurement, process control, or other requirements. Equipment including, but not limited to, cooling and/or heating devices, deposition chambers, reaction chambers, fluid or reagent mixing devices and vessels, transferring systems and devices, computer interfaces, and robotic systems/equipment as will be selected by the person of skill in the art are hereby incorporated. Deposition vessel 12 will now be further described with reference to FIGS. 4a-4e.

Figure 4A:
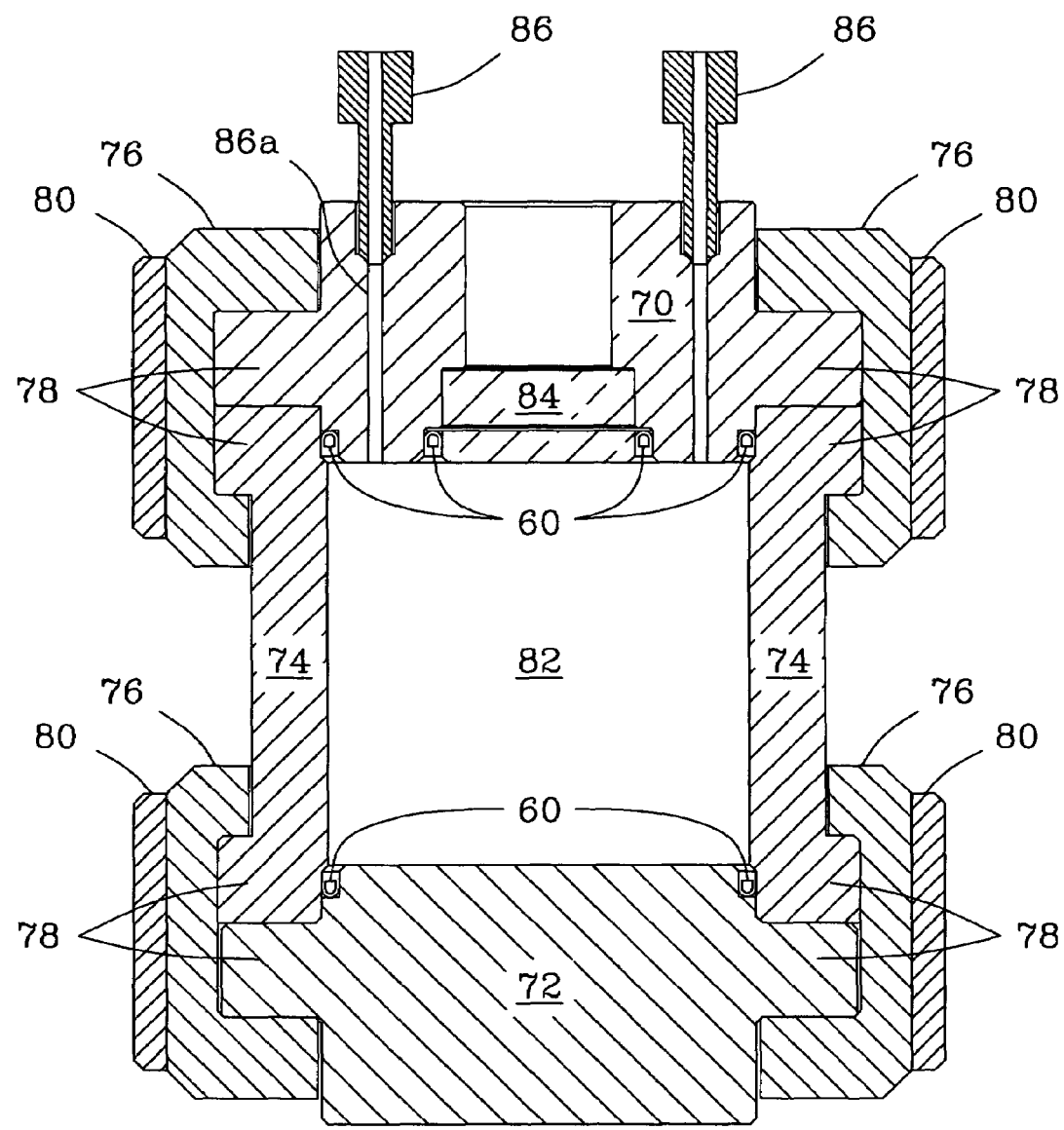
FIG. 4a presents a vertical cross-sectional view of a deposition vessel including a top vessel section, a bottom vessel section and a center vessel section defining a deposition chamber for selectively depositing materials.

FIG. 4a illustrates a vertical cross-sectional view of a deposition vessel 12, e.g., a series 4560 Mini Bench Top Parr® reactor (Moline, Ill.), having a bench-scale design, comprising a top vessel section 70, a bottom vessel section 72, and a center vessel section 74 machined of a refractory metal, e.g., titanium. Sections 70, 72, and 74 are assembled and secured in place with split C-type clamps 76 that mount sliding over securing rim portions 78 machined into each of top 70, bottom 72, and center 74 vessel sections, respectively, effecting a pressure and temperature seal in vessel 12. Clamps 76 are secured in place via a screw-down locking ring 80 positioned about the perimeter of clamps 76. When assembled, top section 70, bottom section 72, and center section 74 define a deposition chamber 82. A window 84 composed of sapphire (Crystal Systems Inc., Salem, Mass. 01970) is optionally positioned in top vessel section 70 for inspecting and observing phase and mixing behavior of fluids and reagents introduced to chamber 82. Chamber 82 is optionally viewed through window 84 in conjunction with a high performance camera (not shown), e.g., a Panasonic model GP-KR222 Color CCD camera (Rock House Products Group, Middletown, N.Y.) coupled to a standard terminal display (not shown), or other viewing system. No limitations are intended. Vessel 12 is configured with four ports 86 for introducing or removing fluids from chamber 82, but is not limited thereto. Vessel 12 may be further operated in conjunction with a heat-exchanger 44 in cold-wall deposition mode, or without exchanger 44 in hot-wall deposition mode.

Figure 4B:
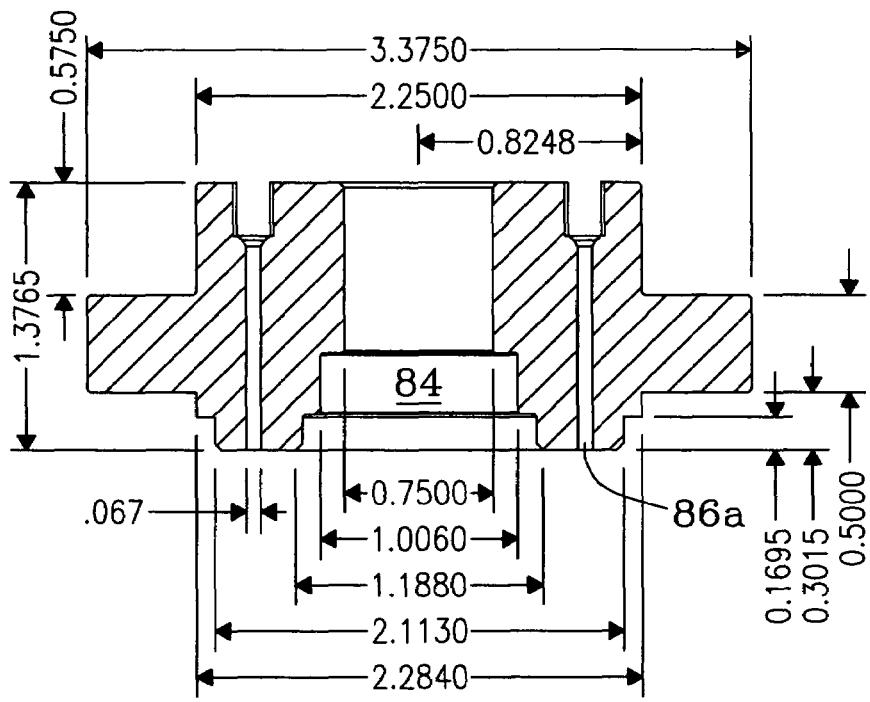
FIG. 4b presents a vertical cross-sectional view of a top vessel section of a deposition vessel illustrating inlet and outlet lines to a deposition chamber, including dimensions, according to an embodiment of the invention.
Figure 4C:
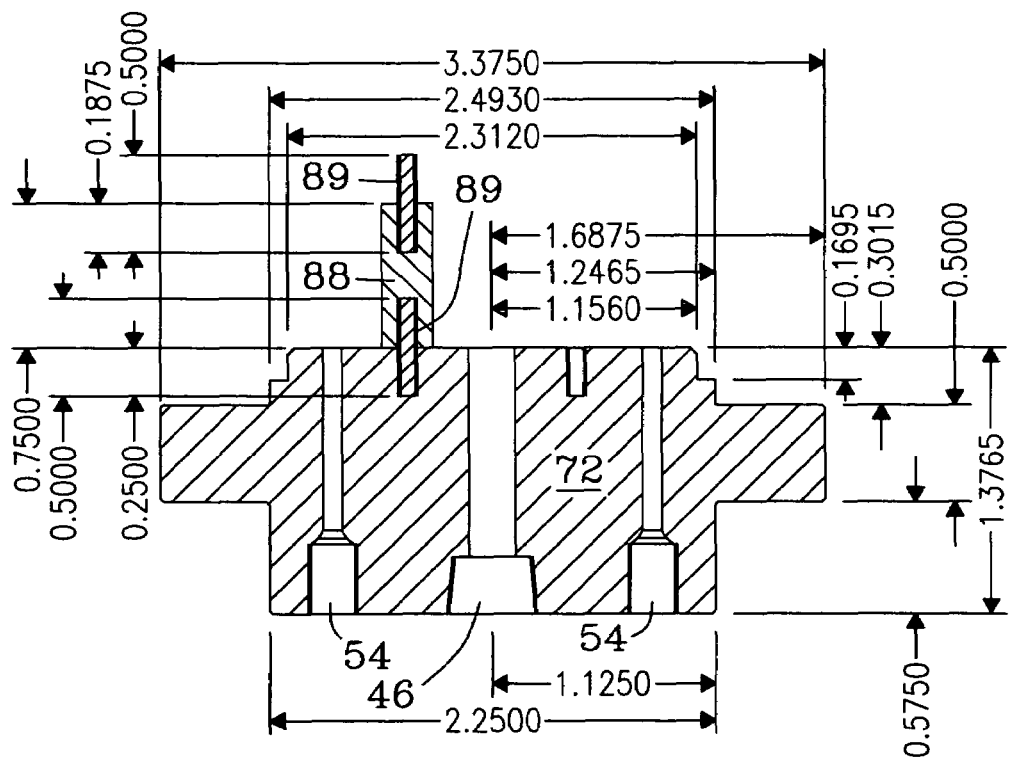
FIG. 4c presents a vertical cross-sectional view of a bottom vessel section of a deposition vessel illustrating feedthroughs to a heating source, to a heat exchanger coil, and to thermocouples, according to an embodiment of the the invention.
Figure 4D:
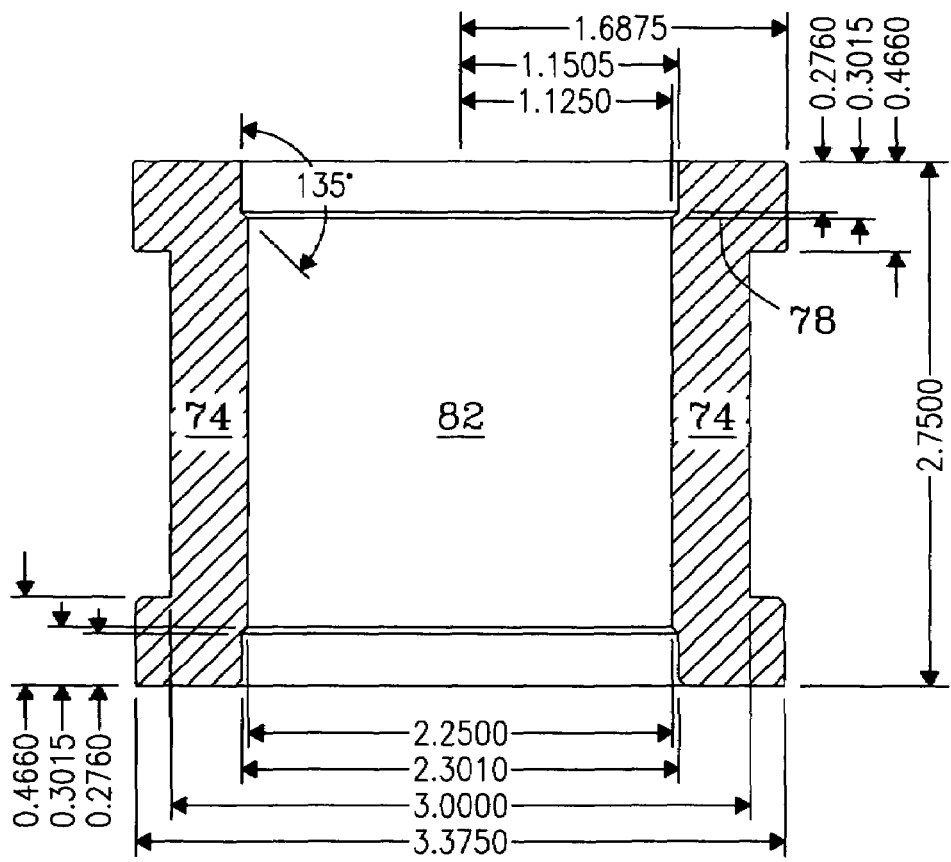
FIG. 4d presents a vertical cross-sectional view of a center vessel section of a deposition vessel including dimensions, according to an embodiment of the apparatus of the invention.

FIGS. 4b-4d present dimensions for deposition vessel 12 (described previously with reference to FIG. 4a), including top vessel section 70, bottom vessel section 72, and center vessel section 74, respectively. In FIG. 4b, window 84 of top vessel section 70 has dimensions of 1.006 inches (2.56 cm) in diameter and 0.508 inches (1.29 cm) in thickness, but is not limited thereto. Ports 86 include a bore 86a having a dimension of about 0.067 inches (0.17 cm) I.D. for introducing fluids (solvents, reagents, premixed fluids, etc.) to vessel 12.

FIG. 4c lists offsets and dimensions in bottom vessel section 72 for feedthrough 46 that links electrical wiring of (i) current source 30 to heating stage 38 and (ii) thermocouples 50 within chamber 82 of vessel 12 to respective readout and/or display device(s) 34, described previously. Feedthrough(s) 54 provide entry and/or exit points for cooling coils of exchanger 44 linking to cooling source 32 external to vessel 12. Feedthrough(s) 54 are sealed using high-pressure pressure fitting(s), e.g., high-pressure PEEK™ fittings (UpChurch Scientific Inc., Whidbey Island, Wash.). At least two staging posts 88, e.g, machinable glass ceramic posts 88 available commercially from McMaster-Carr (Los Angeles, Calif.), having dimensions as shown, are used for mounting heating stage 38. Posts 88 sold under the trademark MACOR® (Corning Inc., Corning, N.Y.), comprise about 55% fluorophlogopite mica and about 24% borosilicate glass, anchored to bottom vessel section 72 and to stage 38 with tantalum screws 89 and molybdenum nuts (not shown) available commercially, e.g., in an M-2 heater kit (GE Advanced Ceramics, Strongsville, Ohio).

FIG. 4d illustrates a vertical cross-sectional view of center vessel section 74 and chamber 82 listing dimensions that include a vertical height of about 2.198 inches (5.58 cm), a diameter of about 2.25 inches (5.715 cm), and internal fluid volume of approximately 140 mL, but is not limited thereto. For example, chamber 82 and associated components may be appropriately scaled and/or positioned for intended manufacturing, deposition, and/or operational processes or purposes. All configurations as will be selected by the person of skill in the art are hereby incorporated.

Figure 4E:
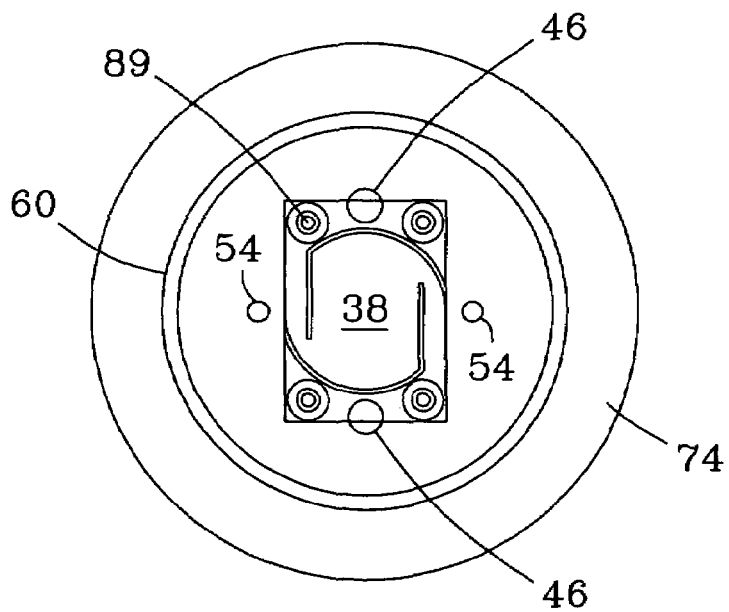
FIG. 4e presents a horizontal cross-sectional (superior) view of a bottom vessel section of a deposition vessel illustrating components mounted therein including a heating stage, posts for mounting and securing the heating stage, feedthroughs providing entry and exit points for electrical and thermocouple wiring and heat exchanger coils, according to an embodiment of the invention.

FIG. 4e presents a horizontal cross-sectional (superior) view of bottom vessel section 72 illustrating components mounted thereto or located thereon, including heating stage 38 and posts 89 for securing stage 38. Feedthrough(s) 54 provide entry and exit points for cooling coils of heat exchanger 44 through bottom vessel section 72 linking to cooling source 32 external to vessel 12, as described previously. Feedthrough(s) 46 provide entry points for electrical wiring 48 and thermocouple leads 52 (FIG. 2) described hereinabove) from current source 30 to stage 38 and from temperature display devices 34 to thermocouples 50 in vessel 12, respectively. Seal 60 provides a pressure and temperature seal to vessel 12 upon assembly.

Solvents

Solvents used in conjunction with the present invention are fluids selected from the group of compressible or liquefied (densified) fluids or gases, near-critical fluids, and supercritical fluids including, but not limited to, carbon dioxide, ethane, ethylene, propane, butane, sulfurhexafluoride, ammonia, and derivatives thereof, e.g., chlorotrifluoroethane, having a fluid density ($\rho$) above the critical density ($\rho_c$) for the neat fluid (i.e., $\rho > \rho_c$). The critical density ($\rho_c$) for the neat fluid is defined by equation [3]:

$$\rho_c = \left[\left(\frac{1}{V_c}\right) \times (M.W.)\right] \qquad [3]$$

where $V_c$ is the critical volume (ml/mol) and M.W. is the molecular weight (g/mol) of the constituent fluid ("Properties of Gases and Liquids", 3ed., McGraw-Hill, pg. 633). Carbon dioxide ($CO_2$) is an exemplary solvent given its useful critical conditions (i.e., $T_c$=31° C., $P_c$=72.9 atm, CRC Handbook, 71$^{st}$ ed., 1990, pg. 6-49, the critical density ($\rho_c$) being approximately 0.47 g/mL) and low surface tension exerted on pattern features (about 1.2 dynes/cm at 20° C., Encyclopedie Des Gaz", Elsevier Scientific Publishing, 1976, pg. 338). Densified $CO_2$ further exhibits a 100-fold better diffusion compared to aqueous fluids [see, e.g., Chemical Synthesis Using Supercritical Fluids, Philip G. Jessop, Waltner Leitner (eds.), Wiley-VCH, pg. 38]. In particular, temperatures for densified $CO_2$ are selected in the range from about −56° C. to about 150° C. with a pressure up to about 10,000 psi. More particularly, temperatures of densified $CO_2$ are selected up to about 60° C. with a pressure in the range from about 850 psi up to about 3000 psi. Most particularly, temperatures of densified $CO_2$ are selected at or near room temperature from about 20° C. to about 25° C. ($CO_2$ is liquid at these temperatures for cold-wall vessel operation) with a pressure of about 1100 psi and a density exceeding the critical density of pure $CO_2$ (i.e., $\rho_c$>0.47 g/cc). Suitable temperature and pressure regimes above the critical density may be chosen from standard plots of reduced pressure ($P_r$) as a function of reduced density ($\rho_r$) where the corresponding reduced temperatures ($T_r$) is specified. The person of skill in the art will recognize that many selections for pressure and temperature are possible. In general, densified fluids at supercritical fluid (SCF) conditions need only exceed their critical parameters. Thus, for a $CO_2$-based system, above a temperature of about 32° C., a pressure for the SCF system need only exceed the critical pressure of $CO_2$. Many temperatures for SCF systems are practicable if the density of the solution mixture is maintained above that needed for solubility, meaning many density increases may be exploited in a densified fluid by effecting changes to pressure and/or temperature in the system. Similar or greater effects can be attained in SCF fluids where higher densities may be exploited as a function of pressure and/or temperature.

Precursors

Any precursor comprising a deposition material having solubility in and stability at the liquid, near-critical, or supercritical temperatures and pressures of the selected solvent system which releases a deposition material at specified release temperatures capable of being deposited to a surface may be chosen, e.g., as reported by Watkins et al. (U.S. Pat. No. 6,689,700) and Kondoh et al. [Jpn. J. Appl. Phys. (43) No. 6B, 2004], incorporated herein in their entirety. No limitations are hereby intended. Precursors include, but are not limited to, metal chelates, metal carbonyls, transition metal coupling agents, diketonates, complexing agents, and organometallic compound reagents. Examples include copper (I) and copper (II) organometallic compounds of the general form CuL or $CuL_2$ where L is a ligand(s) selected from alkynes, olefins, hexafluoroacetylacetonate (hfac) and its hydrates, cyclooctadienes (cod), and vinyl trimethylsilanes (vtms), e.g., copper (I) (hexafluoroacetylacetonate)-2-methyl-1-hexene-3-yne [Cu(hfac)-2-methyl-1-hexene-3-yne)], Cu(hfac)-2-butyne, Cu(I)-hexafluoro-2,4-pentanedionate-(cyclooctadiene) complex [CAS No. 86233-74-1]; Copper (I) (hexafluoroacetylacetonate)(vinyltrimethylsilane) complex [i.e., Cu(hfac)(vtms)]; Copper (I)(hexafluoropentanedionate) (vinyltrimethylsilane) complex [Cu(hfac)(vtms)] [CAS No. 139566-53-3]. Copper (II) precursors include, but are not limited to, Cu(II) beta diketonates, Cu(II) bis(2,2,6,6,8,8-heptafluoro-2,2-dimethyl-3-5-octanedionate), Cu(II) bis(2,2,6,6-tetramethyl-3,5,heptanedionato, Cu(II) acetylacetonate, Cu(II)(hexafluoroacetylacetonate) (vinyltrimethylsilane) complex [i.e., Cu(hfac)(vtms)]; Cu (II) hexafluoro-2,4-pentanedionate [CAS# 14781-454] or Cu (II) hexafluoroacetylacetonate [i.e., $Cu(hfac)_2$] and its hydrates, e.g., Cu(II) hexafluoroacetylacetonate hydrate [$Cu(hfac)_2 \cdot 2H_2O$] [CAS No. 155640-85-0, Sigma-Aldrich, Milwaukee, Wis. 53233], and Cu (II) diisobutyrylmethanate [$Cu(dibm)_2$].

Another copper precursor, sold commercially under the tradename CUPRASELECT BLEND® (Schumacher, Carlsbad, Calif.) comprising Cu(I) (Hexafluoroacetylacetonate) (trimethylvinylsilane) [i.e., Cu(I)(hfac)(tmvs)] [CAS No. 139566-53-3], disproportionates to release (i) $Cu^0$ directly to surfaces at a specified release temperature, and (ii) $Cu^{+2}$ [i.e., as $Cu(II)(hfac)_2 \cdot 2H_2O$ +2(tmvs)] which is soluble in the solvent medium and is suitable for use at selected temperature and/or reaction conditions. Organometallic compounds include, e.g., metal carbonyls and metal diketonates including, e.g., trirutheniumdodecacarbonyl [$Ru_3(CO)_{12}$] [CAS No. 15243-33-1], and ruthenocene (also known as cyclopentadienylruthenium [$RuCp_2$]) [CAS No. 1287-13-4]. Other deposition precursors suitable for use in conjunction with the invention include reagents known in the chemical vapor deposition (CVD), atomic layer deposition (ALD), atomic layer epitaxy, High-Density Plasma CVD (HDP-CVD), and/or metal organic CVD (MOCVD) disciplines, including, but not limited to, titanium tetra-dimethylamide ($Ti(NC_2H_6)_4$ or TDMAT) [CAS No. 3275-24-9, Schumacher Chemicals, Carlsbad, Calif. 92009], a titanium nitride precursor; tetrakis (dimethylamido) tantalum (V) [$Ta(NMe_2)_5$), Strem Chem. Co., Newburyport, Mass. 01950-4098] and tris(diethylamido)(ethylimido) tantalum(V) [$Ta(NEt)(NEt_2)_3$), Sigma-Aldrich, Milwaukee, Wis. 53233], tantalum precursors; and bis (tertbutylimido)bis(dimethylamido) tungsten (VI) [$(t-BuN)_2 (Me_2N)_2W$, Sigma-Aldrich, Milwaukee, Wis. 53233] [CAS No. 406462-43-9], tungsten precursor. No limitations are intended.

Table 1 lists two exemplary material precursors tested in accordance with the present invention. As shown in Table 1, release

TABLE 1

Release temperatures (based on thermal decomposition) for various material precursors.

| Deposition Material | Precursor | Release Temperature** (° C.) |
|---|---|---|
| Ru | $Ru_3(CO)_{12}$ | 140-150 |
| Cu | $Cu(hfac)_2$ | 220 |

**MSDS, Strem Chemicals, Inc., Newburyport, MA. 01950-4098 temperatures for ruthenium and copper from the respective precursors, trirutheniumdodecacarbonyl [$Ru_3(CO)_{12}$] [CAS No. 15243-33-1] and Cu(II) hexafluoroacetylacetonate [$Cu(hfac)_2 \cdot H_2O$] [CAS No. 14781-45-4], differ substantially. As illustrated, precursors may be selected having release temperatures that permit selective deposition over a wide range of temperatures or temperature gradient conditions applicable to manufacturing processes of interest, e.g., semiconductor chip fabrication. No limitations are hereby intended. For example, various chemical and physical processes are known to alter the release temperature(s) for precursor materials, including, but not limited to, catalytic processes, pressure, chemical reagents, etc. Thus, all precursors that release deposition material(s) in response to temperatures, chemical and physical processes, and/or selected reaction conditions are within the scope of the present invention.

Reagents

Chemical additives and reagents effecting deposition to a surface or substrate are suitable for use in conjunction with the invention. Reagents include, but are not limited to, reactive chemical agents, non-reactive chemical agents, reducing agents, oxidizing agents, catalytic agents, and co-solvents. In particular, reagents miscible in the solvent fluid at liquid, near-critical, or supercritical conditions for the solvent may be selected, including, e.g., hydrogen ($H_2$), ketones (e.g., acetone), and alcohols (e.g., methanol, and ethanol). Hydrogen is an exemplary reagent effective as a reducing agent and/or oxygen scavenger. Hydrogen is further miscible in solvent fluids including, but not limited to, carbon dioxide, at the liquid, near-critical, or supercritical temperatures for the carbon dioxide solvent, e.g., 31° C. Reagents may be introduced as solids, liquids, or gases directly to the deposition chamber or may be premixed in a solvent and delivered to the deposition chamber at liquid, near-critical, or supercritical temperatures for the solvent. Alternatively, reagent(s) may be delivered to the chamber at lower temperatures and subsequently heated to the desired liquid, near-critical, or supercritical temperature. Thus, no process limitations are hereby intended.

The person of skill in the art will further recognize that the invention is not limited by type of reaction or sequence of reactions occurring, e.g., between precursor(s), reagent(s), and/or deposition material(s). Reactions include, but are not limited to, reduction, oxidation, disproportionation, dissociation, decomposition, displacement, hydrolysis, photolysis, hydrogenation, including combinations thereof. For example, release of a deposition material, e.g., by thermal decomposition, dissociation, or displacement, from a precursor to the solvent fluid may be effected in a deposition vessel or reaction chamber permitting subsequent reaction with, e.g., a reducing reagent, and ultimate deposition to a substrate or surface. In another example, introduction of a gas, solid, or liquid reagent to the deposition vessel or reaction chamber can initiate reaction between a precursor and a reagent, and/or between a deposition material released from the precursor and a reagent. All reagents as will be selected by the person of skill in the art are within the scope and spirit of the present invention.

Temperature and pressure choices for the deposition chamber will depend in part on the solvent and reagent choices employed as will be understood by the person of skill in the art. In particular, stage temperatures may be selected in the range from about −100° C. to about 1500° C. (via cooling and/or heating) with pressures in the deposition vessel ranging from about 1 psi to about 20,000 psi. More particularly, temperatures may be selected in the range from about 25° C. to about 600° C. with pressures in the range from about 500 psi to about 5000 psi. Most particularly, temperatures may be selected in the range from about 100° C. to about 200° C. with pressures in the range from about 2000 psi to about 3000 psi. No limitations are intended.

Figure 5:
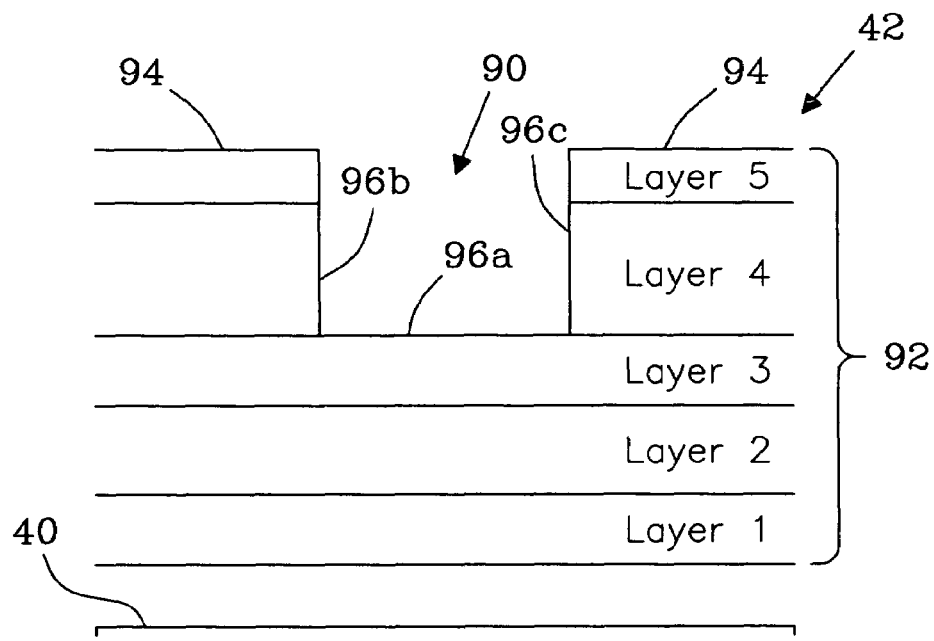
FIG. 5 illustrates a composite substrate comprising features (e.g., vias), various layers (e.g., exposed layers, metal layers, thin-film layers, imbedded layers), surfaces (e.g., external surfaces, flat surfaces, horizontal surfaces, vertical surfaces, etc.), sub-surfaces (e.g., feature surfaces), and/or other substrate structures of a type suitable for selective deposition in accordance with the invention.

FIG. 5 illustrates a typical composite substrate 42 comprising features 90 (e.g., vias), layers 92 (e.g., exposed layers, thin-film layers, imbedded layers), surfaces 94 (e.g., external surfaces, flat surfaces, horizontal surfaces, vertical surfaces, etc.), sub-surfaces 96a, 96b, and 96c (e.g., feature surfaces), and/or other complex substrate structures (e.g., voids, tunnels, interconnected tunnels, and the like). Such features, layers, and surfaces are representative of types of structures found in manufactured or composite substrates, e.g., silicon wafers in semiconductor chip manufacturing where, e.g., barrier films are deposited. Feature patterns 90 include e.g., vias, wells, trenches, gaps, holes, and/or other patterned structures having complex geometries and surfaces including horizontal, vertical, and flat surfaces. In the figure, a heating source 40 for heating substrate 42 is co-located with substrate 42 but is not limited thereto. For example, multiple sources 40 of like or different kind positioned at various orientations relative to substrate 42 are suitable for use as will be selected by the person of skill in the art. Thus, no limitation is intended.

General Procedure for Selective Deposition

The following general procedure describes use of system 10 for selectively depositing materials on a substrate 42, e.g., a semiconductor chip. Substrate 42 is mounted to heating stage 38. Substrate 42 is in proximity to a known mass of a precursor 58 comprising a deposition material. Vessel 12 is sealed, pressurized, and filled, e.g., with a compressible solvent fluid, e.g., carbon dioxide. In one configuration, a reagent is optionally added as an oxygen scavenger or reducing agent. In the instant configuration, solvents and reactants are transferred into deposition vessel 12 from sources 14 and 16, respectively, but are not limited thereto. For example, sources 14 and 16 may comprise any of a multitude of delivery means including, e.g., high-pressure transfer manifolds or tanks. The solvent fluid 59 including any reagents and/or precursors may be optionally mixed in a premixing cell 36 optionally lined with a high-strength polymer liner, e.g., polyether-ether ketone sold under the tradename PEEK® (Victrex USA Inc., Greenville S.C.) or poly-tetra-fluoro-ethylene sold under the tradename Teflon® (Dupont, Wilmington, Del.) prior to introduction to vessel 12. In vessel 12, flow of cooling water through coils of heat exchanger 44 is initiated at a rate necessary to maintain a desired temperature of fluid 59, dissolution and miscibility of precursor 58, and temperature of substrate 42. In one embodiment, vessel 12 is operated in "cold-wall" deposition mode in conjunction with use of heat exchanger 44. In another embodiment, vessel 12 is operated in "hot-wall" deposition mode, e.g., without use of heat exchanger 44. Substrate 42 is exposed to solvent fluid 59 containing any reagent(s) (or reagent fluids) at liquid, near-critical or supercritical or conditions for the solvent thereby mixing precursor 58 and any added reagent(s). A temperature gradient is generated at, in, on, through, or along a deposition surface by heating substrate 42 in conjunction with heating source 40 (internal to stage 38) in the presence or absence of active temperature control provided by exchanger 44. Deposition material released from the precursor 58 is selectively deposited at, in, on, or along the deposition surface (or portion thereof) in response to the temperature gradient generated at, in, on, or along the deposition surface, e.g., to surfaces, layers, and/or feature patterns of substrate 42 exceeding the release temperature for the precursor 58. In the instant configuration, temperatures are measured using thermocouples 50 or other temperature measuring devices or means positioned near, or in, any of heating stage 38, heating source 40, substrate 42, and/or solvent fluid 59, respectively. In particular, temperature gradients in the range from about 600° C. per unit distance (or thickness) to about 25° C. per unit distance (or thickness) promote selective deposition. More particularly, temperature gradients in the range from about 500° C. per unit distance to about 150° C. per unit distance promote selective deposition. Most particularly, temperature gradients in the range from about 400° C. per unit distance to about 150° C. per unit distance promote selective deposition. No limitations are hereby intended.

Figure 6:
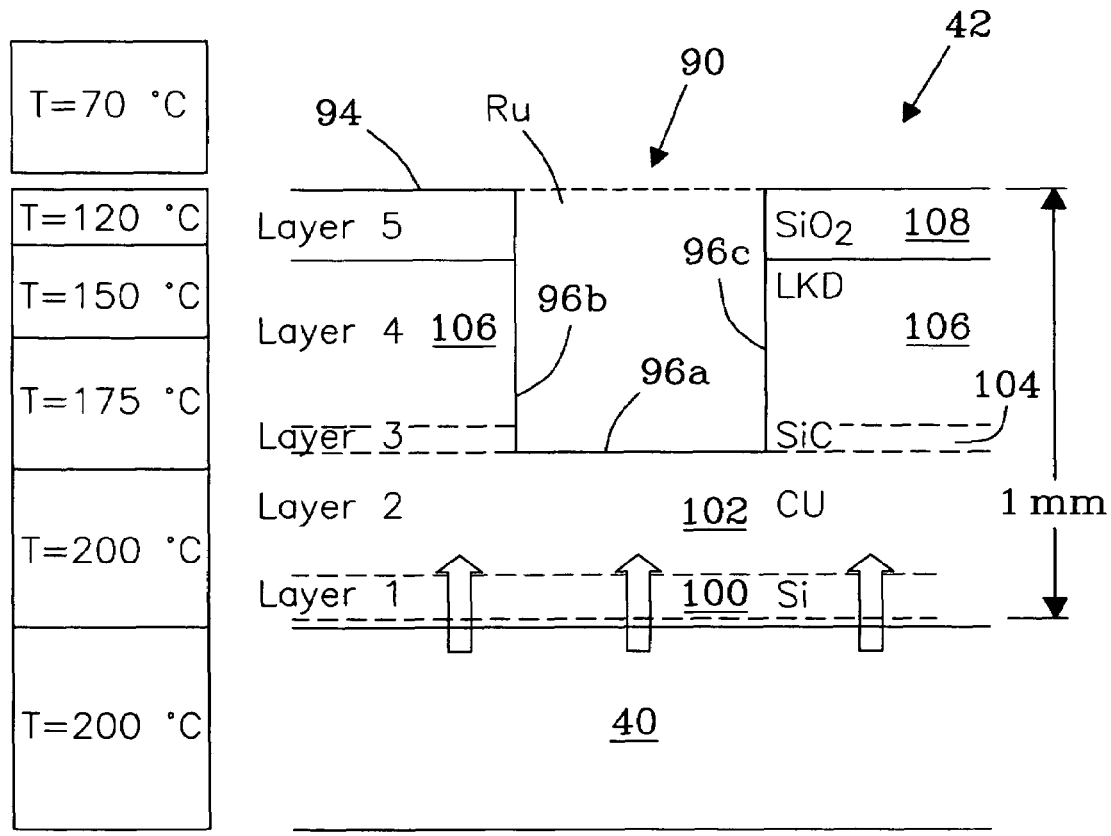
FIG. 6 illustrates a composite substrate, e.g., a semiconductor chip coupon, illustrating a temperature gradient in accordance with the invention for effecting deposition of a deposition material (e.g., ruthenium metal) selectively filling substrate pattern features (e.g., vias) in response to the temperature gradient.

FIG. 6 illustrates a composite substrate 42 (test coupon) tested in conjunction with the present invention, i.e., semiconductor chip. Substrate 42 comprises various structures and surfaces including, but not limited to, vias 90 (pattern features), external surfaces 94, (via) surfaces 96a, 96b, and 96c, and layers 100-108, including horizontal and vertical surfaces, interfaces, exposed imbedded surfaces, and/or subsurfaces thereof. The instant substrate 42 comprises a silicon layer 100, a (imbedded) copper layer 102, a silicon carbide (SiC) layer 104 as an etch-stop barrier, a dielectric layer 106 comprising an organosilane glass (OSG) or other low-k dielectric (LKD) material, and a cap coating layer 108 comprising silicon dioxide ($SiO_2$) or other thin film material as an insulating overlayer. Test coupon 42 was generally of a "barrier open" (BO) configuration describing wafer processing that introduced pattern feature vias 90 into substrate 42 through layer 108 ($SiO_2$) and layer 106 (LKD) further breaching layer 104 (SiC etch stop layer) opening into layer 102 (imbedded copper layer). A temperature gradient established between, e.g., heating source 40 and surface 94, generates temperatures suitable for selective deposition in, e.g., the vias 90, e.g., along surfaces 96a, 96b, and 96c, the deposition occurring when at least one temperature in the temperature gradient exceeds the release temperature for the precursor 58. Solvent fluid 59 is typically maintained at a temperature lower than the temperature of surface 94 thereby maintaining the necessary temperature at, in, on, through, or along the surface where selective deposition is desired.

In general, maintaining a temperature at a deposition surface (e.g., surfaces 96a, 96b, and 96c) at, or greater than, the release temperature for the precursor 58 while maintaining other surfaces, e.g., surface 94, at temperatures substantially lower than the release temperature promotes selective deposition at the desired surface(s). The person of skill in the art will further recognize that deposition thickness is controlled by factors including, but not limited to, concentration (e.g., of reagents, precursors, etc.), deposition rates, precursor diffusion, and deposition time.

In an embodiment of the invention illustrated in FIG. 6, source 40 heats substrate 42, generating a temperature gradient between source 40 at a first temperature (e.g., 200° C.) and surface 94 maintained at a second temperature (e.g., 120° C.). As the temperature at the desired deposition surface(s) 96a, 96b, and 96c exceeds the release (e.g., decomposition) temperature for the precursor (e.g., 150° C.), deposition is initiated and promoted selectively in pattern vias 90 along the temperature gradient. In an example (detailed in Example 1 and illustrated in FIG. 7), ruthenium metal released from a precursor 58 is deposited selectively in pattern vias 90 filling the vias 90.

Figure 8:
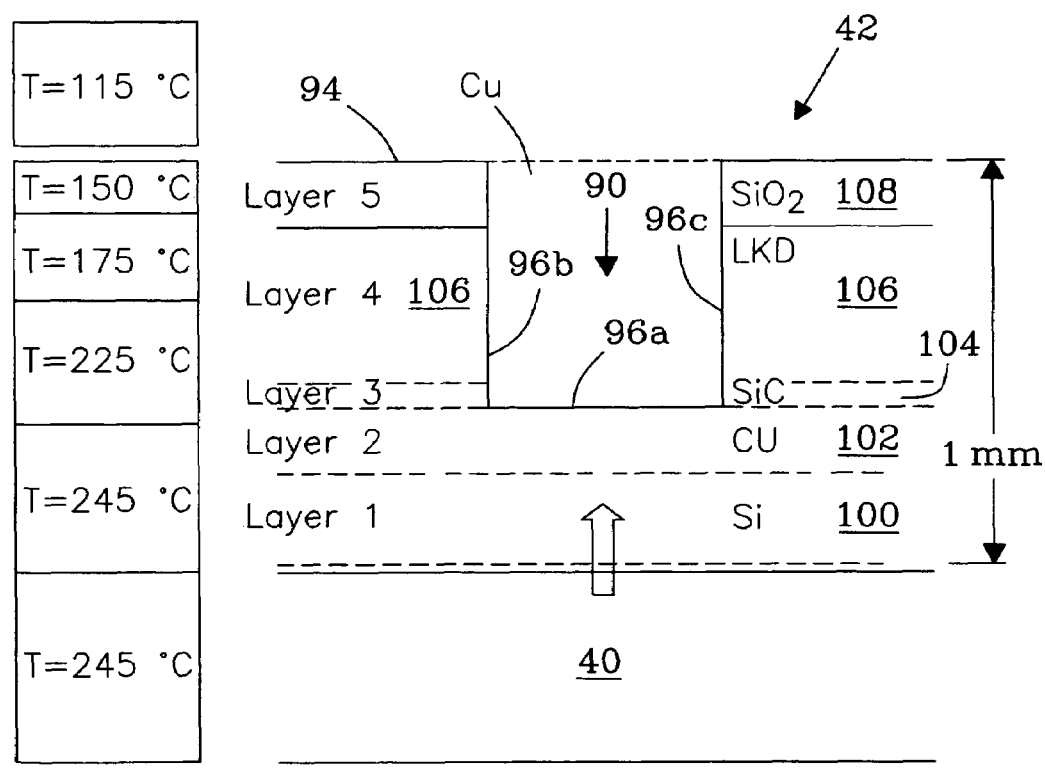
FIG. 8 illustrates a composite substrate, e.g., a semiconductor chip coupon, illustrating a further temperature gradient in accordance with the invention for effecting deposition of a deposition material (e.g., copper metal) selectively filling substrate pattern features (vias) in response to the temperature gradient.

In another embodiment of the invention illustrated in FIG. 8, source 40 heats substrate 42, generating a temperature gradient between source 40 at a first temperature (e.g., 245° C.) and surface 94 maintained at a second temperature (e.g., 150° C.). As the temperature at the desired deposition surface (s) 96a, 96b, and 96c of pattern vias 90 exceeds the release (e.g., decomposition) temperature for the chosen precursor (e.g., 220° C.), deposition is initiated and promoted in pattern vias 90 along surfaces 96a, 96b, and 96c in response to the temperature gradient. In an example (detailed in Example 2 below), copper metal released from a precursor 58 is deposited selectively in vias 90 filling the vias 90.

Figure 9:
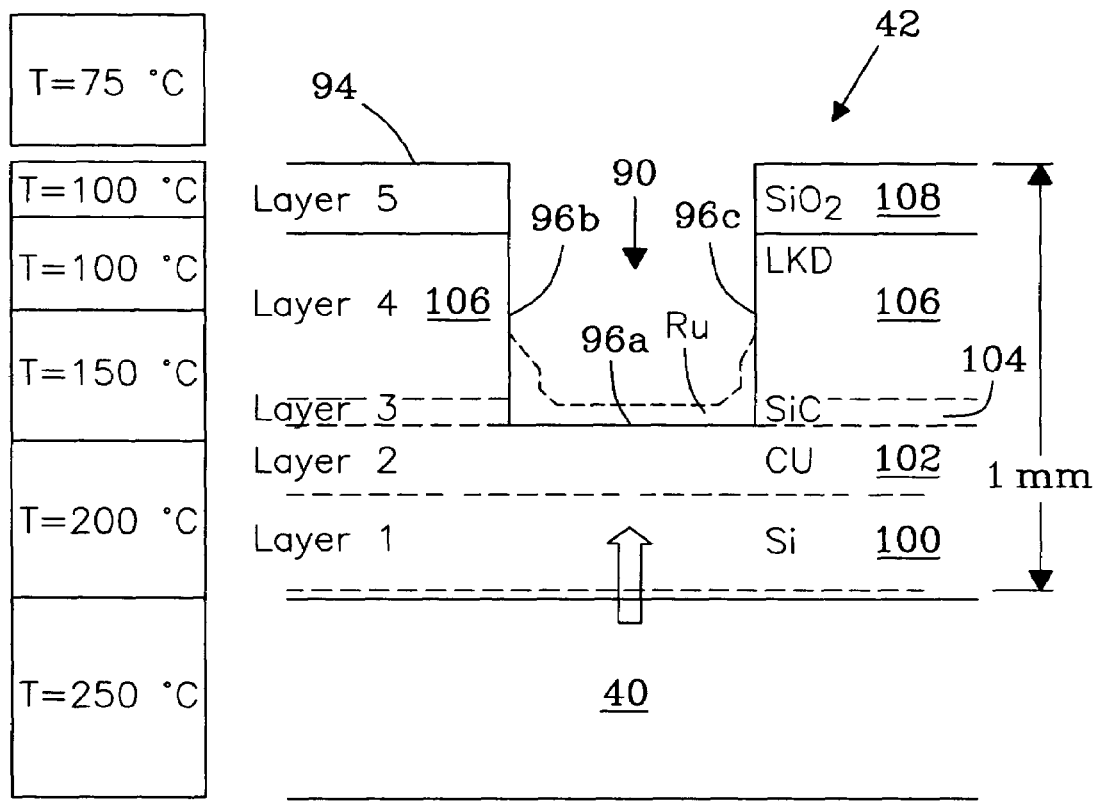
FIG. 9 illustrates a composite substrate, e.g., a semiconductor chip coupon, illustrating yet another temperature gradient in accordance with the invention for effecting deposition, e.g., in a bottom-up deposition mode, of a deposition material (e.g., ruthenium metal) in pattern features (vias) coating selected portions of the features in response to the temperature gradient.

In another embodiment of the invention illustrated in FIG. 9, source 40 heats substrate 42 generating a temperature gradient (e.g., ~150° C./mm of substrate) between source 40 at a first temperature (e.g., 250° C.) and surface 94 maintained at a second temperature (e.g., 100° C.). As temperature along surface(s) 96a, 96b, and/or 96c exceeds the release temperature for the precursor, deposition is initiated and promoted in pattern vias 90 along surfaces 96a, 96b, and 96c or portions thereof in response to the temperature gradient. For example, deposition is not generally observed on surfaces 96b and 96c maintained at a temperature below the release temperature for the precursor, e.g., 100° C. Deposition is thus controlled selectively filling portions of pattern vias 90. In an example (detailed in Example 3 and FIG. 10), ruthenium metal released from a precursor 58 is deposited selectively in the pattern feature vias 90 partially filling and/or coating selected portions of the vias 90.

Figure 11:
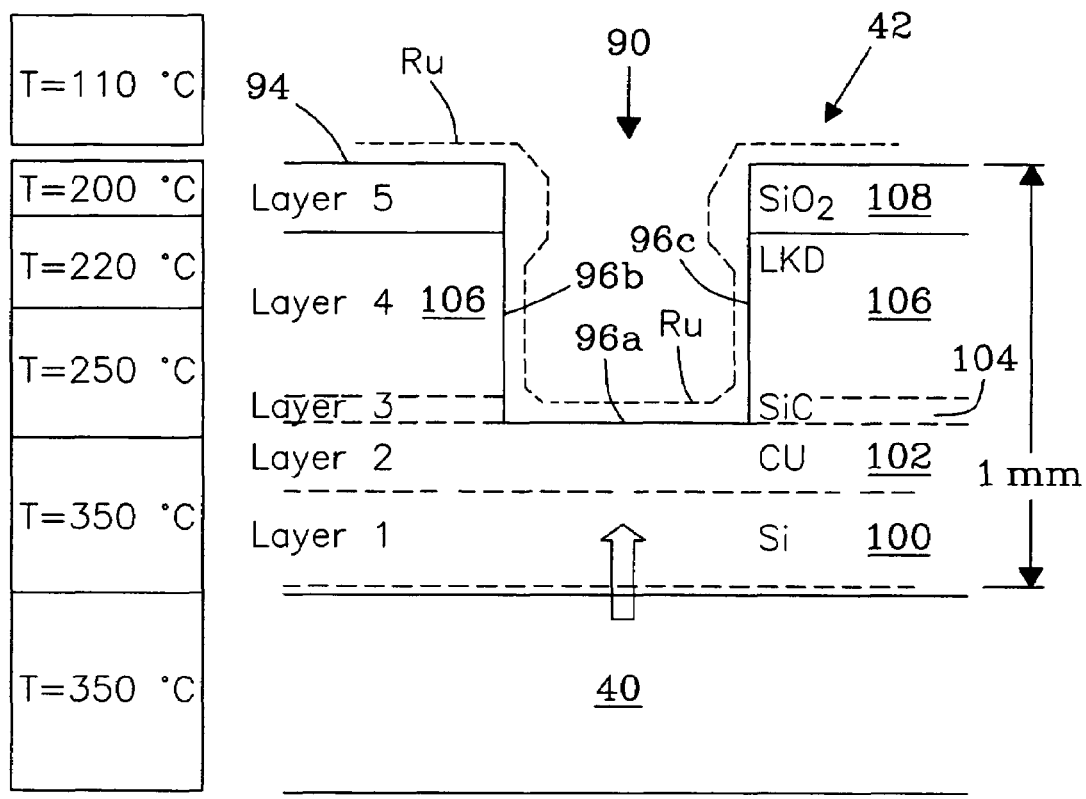
FIG. 11 illustrates a composite substrate, e.g., a semiconductor chip coupon, illustrating still yet another temperature gradient in accordance with the invention for effecting deposition of a deposition material (e.g., ruthenium metal) to external surfaces and to pattern features (vias), e.g., in a top (external) surface-down deposition mode, selectively coating the features and surfaces in response to the temperature gradient.

In another embodiment of the invention illustrated in FIG. 11, source 40 heats substrate 42 generating a temperature gradient (e.g., ~150° C./mm of substrate) between source 40 and/or layer 100 (first location) at a first temperature (e.g., 350° C.), and surface 94 (second location) maintained at a second temperature (e.g., 200° C.). As illustrated, temperatures at surface(s) 94, 96a, 96b, and 96c exceed the release (e.g., decomposition) temperature for precursor 58 (e.g., 150° C.), promoting selective deposition at surface 94 and along surfaces 96a, 96b, and 96c, e.g., in a top surface-down deposition mode. In an example (detailed in Example 4 and FIG. 12), ruthenium metal released from a precursor 58 is shown to deposit selectively to external surface 94 and surfaces 96a, 96b, and 96c along the temperature gradient in the pattern feature vias 90 thereby coating the vias 90.

The invention will now be further demonstrated by reference to the following examples.

EXAMPLES

The following examples are intended to promote a further understanding of conditions and applications as well as evidence supporting selective deposition of materials in accordance with the present invention. Example 1 details conditions whereby ruthenium metal is selectively deposited in pattern features (vias) of a semiconductor chip substrate selectively filling the vias. Example 2 details conditions whereby copper metal is selectively deposited in vias of a semiconductor chip substrate selectively filling the vias. Example 3 details conditions whereby ruthenium metal is selectively deposited along a temperature gradient in vias of a semiconductor chip substrate, e.g., in bottom-up deposition mode, selectively coating vias in response to a temperature gradient therein. Example 4 details conditions whereby ruthenium metal is selectively deposited to both external surfaces and along surfaces of vias of a semiconductor chip substrate, e.g., in top surface-down deposition mode, in response to a temperature gradient.

Example 1

Ruthenium is a promising electrode material in G-bit-scale dynamic random access memories (DRAMs) given its low resistivity, excellent chemical stability and good dry etching properties. In an example of the invention illustrated in FIG. 6, ruthenium metal was selectively deposited in vias 90 (pattern features) of a semiconductor chip substrate 42 filling vias 90. The system involves a solvent fluid 59 comprising densified carbon dioxide, a ruthenium metal precursor, $Ru_3(CO)_{12}$, stable at liquid, near-critical or supercritical temperatures for the solvent fluid, and a stoichiometric excess of a reagent gas, e.g., $H_2$, preventing undesired oxidation reactions in the deposition vessel. Elemental ruthenium (Ru°) released from precursor 58 at or above the decomposition temperature for precursor 58 was deposited to substrate 42 selectively filling pattern vias 90. Substrate 42 was sized by scoring and breaking along the crystal planes, yielding a coupon of about 1 in. to 1.75 in. on a side. Vias 90 had a horizontal length of ~1 µm and a depth of ~200 nm. Post-processing examination of test coupons 42 was conducted using Scanning Electron Microscopy (SEM) and Transmission Electron Microscopy (TEM). Purity of deposition materials was evaluated using X-ray Photoelectron Spectrometry (XPS) analyses.

Experimental. 25 mg of precursor solid, $Ru_3(CO)_{12}$, (Sigma-Aldrich, Milwaukee, Wis.), was weighed into a glass vessel 56 and placed underneath stage 38 in vessel 12. Semiconductor chip substrate 42 was secured to ceramic heating stage 38. Vessel 12 was sealed and chamber 82 was pressurized with 100 psi hydrogen from source 16 through inlet port 86 and to a total pressure of 1100 psi with carbon dioxide ($CO_2$) from source 14 forming the final solvent fluid 59. Chamber 82 was equipped with several K-type thermocouples 50 positioned for measuring temperature of heating stage 38, substrate 42, and solvent fluid 59. Stage 38 was heated to a temperature of 100° C. and constituents of the solvent fluid 59 were allowed to intermix for about 5 to 10 minutes to enhance dissolution of the precursor 58 in the solvent fluid 59. Mixing in chamber 82 was observed through window 84. Temperature of stage 38 was subsequently raised to ~200° C., while temperatures (i) of surface 94 and (ii) of fluid 59 above surface 94 were maintained at about 120° C. and about 70° C., respectively, creating the desired temperature gradient in the via patterns 90 of substrate 42 resulting in selective deposition and filling of the vias 90 with ruthenium metal. Substrate 42 had a contact time in the reagent fluid of about 60 minutes, but is not limited thereto.

Figure 7:
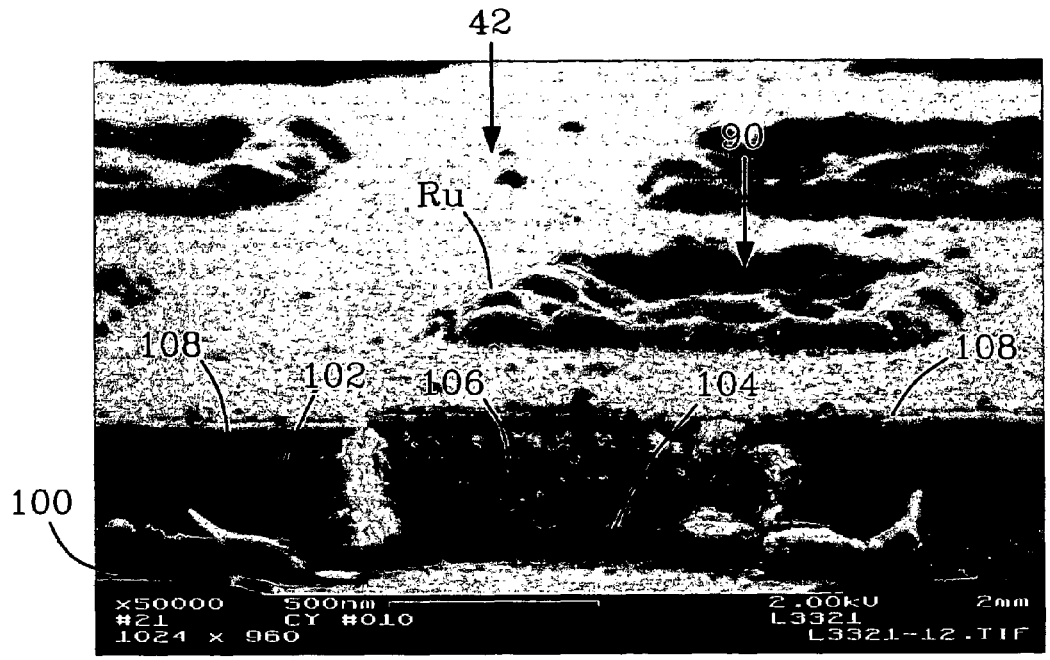
FIG. 7 presents a Scanning Electron Micrograph (SEM) showing selective deposition of ruthenium metal in patterned features (vias) of a semiconductor chip substrate coupon in accordance with an embodiment of the invention.

Results. FIG. 7 presents an SEM micrograph showing selective filling of vias 90 of substrate 42. Thickness of ruthenium metal deposited in the vias 90 was found to be substantially different from the thickness of ruthenium metal located on surface layer 94. In particular, thickness of ruthenium in vias 90 was ~200 nm, extending through the vertical depth of the features. In contrast, ruthenium located on surface 94 had a maximum thickness of ~20 nm. Selective deposition was evidenced by the difference in thickness, e.g., $d_{via} >> d_{surface}$. Results further showed deposition was non-conformal, i.e., asymmetrically deposited to the vias 90.

Example 2

In a further example of the invention illustrated in FIG. 8, copper metal was selectively deposited in the vias 90 (pattern features) of a semiconductor chip substrate 42 selectively filling the vias 90. The system comprises a solvent fluid 59 of densified carbon dioxide, a copper metal precursor 58, e.g., copper (II) hexafluoroacetylacetonate [$Cu(hfac)_2$] (Sigma-Aldrich, Milwaukee, Wis.), and a stoichiometric excess of a reagent gas ($H_2$). Copper ($Cu^{+2}$) is released from precursor 58 to the deposition surface(s) of the vias 90 and reduced by the $H_2$ reagent selectively filling the vias 90. Substrate 42 had dimensions of about 1 in. to 1.75 in. on a side. Vias 90 had a horizontal length dimension of 1 µm and a depth of ~200 nm.

Experimental. 25 mg of solid precursor, e.g., $Cu(hfac)_2$, was weighed into vessel 12 and placed underneath stage 38 in chamber 82. A semiconductor chip substrate 42 as described in Example 1 was secured to ceramic heating stage 38. Vessel 12 was sealed and chamber 82 was pressurized with 100 psi hydrogen from source 16 and to a total pressure of 1100 psi with $CO_2$ from source 14 through inlet port 86 forming the final solvent fluid 59. Chamber 82 was equipped with several K-type thermocouples 50 positioned for measuring temperature of heating stage 38, substrate 42, and fluid 59. Stage 38 was heated to a temperature of 60° C. and constituents of the reagent fluid 59 were allowed to intermix for about 15 minutes to enhance dissolution of the metal precursor 58 in the solvent fluid 59. Mixing in chamber 82 was observed through window 84. Temperature of stage 38 was subsequently raised to ~245° C. Temperatures of (i) surface 94 and (ii) fluid 59 above surface 94 were maintained at ~150° C. and about 115° C., respectively, creating the desired temperature gradient in the via patterns 90 of substrate 42 for selectively filling and controlling copper metal deposition. No coolant flow through exchanger 44 was used for this test. Substrate 42 had a contact time in the reagent fluid of about 60 minutes.

Results. Results in Example 2 were essentially identical to those observed for deposition of ruthenium metal in Example 1. Results again evidenced selective filling of the vias 90. Thickness of copper metal deposited to vias 90 was found to be substantially different from the thickness of copper metal located on surface layer 94. In particular, thickness of copper metal in the vias 90 was ~200 nm extending through the vertical depth of the vias 90. In contrast, copper metal found on the surface 94 exhibited a thickness <<200 nm. Selective deposition was again evidenced, as in Example 1, by the difference in thickness, e.g., $d_{via} >> d_{surface}$. Results further showed deposition was non-conformal, i.e., asymmetrically deposited, to the vias 90.

Example 3

In another example of selective deposition illustrated in FIG. 9, ruthenium metal was selectively deposited in vias 90 of a semiconductor chip substrate 42 partially coating the vias 90 along a temperature gradient generated therein. A ruthenium metal precursor, $Ru_3(CO)_{12}$, and a stoichiometric excess of a reagent gas, e.g., $H_2$, that prevents undesirable oxidation from miscellaneous oxygen sources in the reaction chamber during deposition, were mixed in a solvent fluid 59 of densified $CO_2$. A temperature gradient was generated in the vias 90 in conjunction with a heating source 40 such that elemental ruthenium (Ru°) released from precursor 58 (e.g., above the release temperature for the precursor 58) was selectively deposited to surfaces within the vias 90 where temperature was above the release temperature for the precursor 58 thereby coating vias 90 along the temperature gradient. Substrate coupons 42 were sized by scoring and breaking along the crystal planes yielding a coupon about 1 inch to 1.75 inches on a side. Vias 90 had a horizontal dimension of ~1 µm and a depth of ~200 nm. Post-processing examination of test coupons 42 was conducted using Scanning Electron Microscopy (SEM) and Transmission Electron Microscopy (TEM). Purity of deposition materials was evaluated using X-ray Photoelectron Spectrometry (XPS) analyses.

Experimental. ~25 mg of solid precursor, $Ru_3(CO)_{12}$, (Sigma-Aldrich, Milwaukee, Wis.), was premixed in 1 ml acetone and 30 ml $CO_2$ in a premixing cell 36 at 1100 psi and 25° C.). A semiconductor chip substrate 42 was secured to ceramic heating stage 38 having an internal heating source 40 for heating substrate 42. Vessel 12 was sealed and chamber 82 was pressurized with ~15 psi hydrogen from source 16 through inlet port 86 and to a total pressure of 1100 psi with carbon dioxide ($CO_2$) from source 14. Chamber 82 was equipped with several K-type thermocouples 50 positioned for measuring temperature of heating stage 38, substrate 42, and solvent fluid 59. Stage 38 was heated to a temperature of ~250° C. Temperatures (i) of surface 94 and (ii) of fluid 59 above surface 94 were maintained at ~100° C. and ~75° C., respectively, creating the desired temperature gradient in the via patterns 90. One (1) ml of the predissolved precursor/acetone/$CO_2$ solution was injected into deposition chamber 82 forming the final solvent fluid 59. Substrate 42 had a contact time in the reagent fluid of about 10 minutes, but is not limited thereto.

Figure 10:
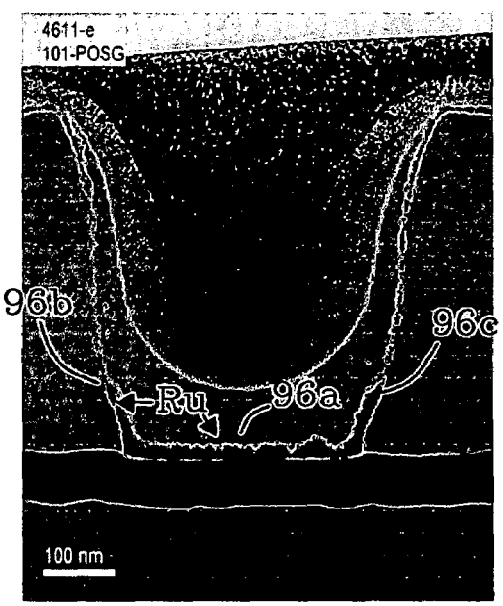
FIG. 10 presents a Scanning Electron Micrograph (SEM) showing deposition of ruthenium metal selectively in patterned features (vias), coating portions of the features, of a semiconductor chip substrate, in accordance with an embodiment of the invention.

Results. As illustrated in FIG. 10, ruthenium was selectively deposited to bottom surface 96a and up along surfaces 96b and 96c in response to the temperature gradient generated between source 40 (at temperature $T_1$ and location $L_1$) to surface 94 (at temperature $T_2$ and location $L_2$) at those locations where temperature exceeded the release temperature for the precursor, about 150° C. Results show ruthenium was selectively deposited to the vias 90 partially coating the vias 90. In particular, results further showed deposition was non-conformal, i.e., the Ru film was asymmetrically deposited to the bottom of the vias 90 and up along a portion of the walls (e.g., surface 96a and up along surfaces 96b and 96c) of the vias 90 where temperature exceeded the release temperature for the precursor 58.

Example 4

In another example of selective deposition illustrated in FIG. 11 ruthenium metal was selectively deposited to (external) surface 94 of a semiconductor chip substrate 42 and along walls (e.g., of surfaces 96a, 96b, and 96c) of vias 90 in a top surface-down deposition mode. A ruthenium metal precursor, $Ru_3(CO)_{12}$, and a stoichiometric excess of a reagent gas, e.g., $H_2$, that prevents undesired oxidation in the reaction chamber during deposition were mixed in a solvent fluid 59 of densified $CO_2$ at liquid, near-critical or supercritical temperatures for the solvent fluid 59. A temperature gradient was generated in the vias 90 in conjunction with a heating source 40 such that elemental ruthenium (Ru°) released from precursor 58 above the release temperature for the precursor 58 was selectively deposited to surfaces 94 exceeding the release temperature for the precursor 58. Substrate coupons 42 were sized by scoring and breaking along the crystal planes yielding a coupon about 1 inch to 1.75 inches on a side. Post-processing examination of test coupons 42 was conducted using Scanning Electron Microscopy (SEM) and Transmission Electron Microscopy (TEM). Purity of deposition materials was evaluated using X-ray Photoelectron Spectrometry (XPS) analyses.

Experimental. ~25 mg of solid precursor, $Ru_3(CO)_{12}$, (Sigma-Aldrich, Milwaukee, Wis.), was premixed in 1 ml acetone and 30 ml $CO_2$ in a premixing cell 36 at 1100 psi and 25° C. A semiconductor chip substrate 42 was secured to ceramic heating stage 38 with an internal heating source 40 for heating substrate 42. Vessel 12 was sealed and chamber 82 was pressurized with ~15 psi hydrogen from source 16 through inlet port 86 and to a total pressure of 1100 psi with carbon dioxide ($CO_2$) from source 14. Chamber 82 was equipped with several K-type thermocouples 50 positioned for measuring temperature of heating stage 38, substrate 42, and solvent fluid 59. Stage 38 was heated to a temperature of ~350° C. Temperatures (i) of surface 94 and (ii) of fluid 59 above surface 94 were maintained at ~200° C. and ~110° C., respectively. One (1) ml of predissolved precursor/acetone/$CO_2$ solution mixed in a premixing cell 36 was injected into deposition chamber 82 forming the final solvent fluid 59. Substrate 42 had a contact time in the reagent fluid of about 10 minutes, but is not limited thereto.

Figure 12:
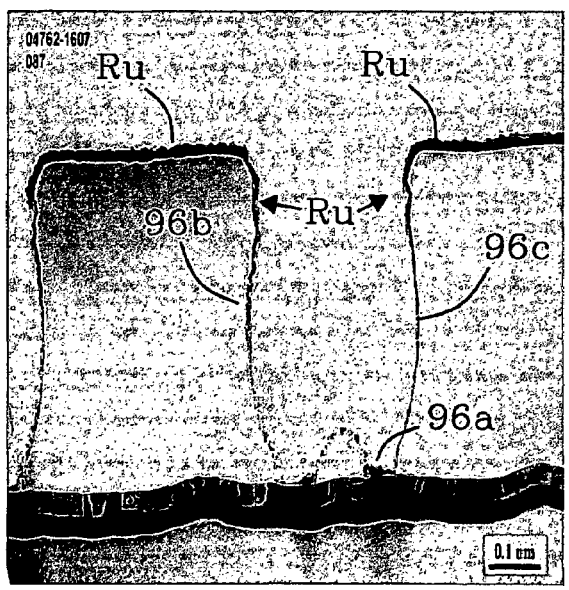
FIG. 12 presents a Scanning Electron Micrograph (SEM) showing selective deposition in response to a temperature gradient of ruthenium metal on top (external) surfaces and along vertical and horizontal surfaces of a patterned feature (e.g., via) coating the features of a semiconductor chip substrate, in accordance with the invention.

Results. As illustrated in FIG. 12, ruthenium metal was deposited selectively to surface 94 of substrate 42 and along walls (e.g., surfaces 96b and 96c, and 96a) of vias 90 in a top surface-down deposition mode. Surfaces 96a, 96b, and 96c of vias 90 exhibited a thin conformal film coating. Surface 94, in contrast, exhibited a film thickness of from about 10 nm to about 20 nm. In Example 4, results demonstrated that surface selectivity was controlled by kinetics and precursor diffusion, where the large surface area of the heated (hot) surface 94 dominated the process for metal deposition. Deposition may thus be controlled in conjunction with multiple parameters, as discussed herein.

Selective deposition in accordance with the present invention offers enhancements and/or alternatives for surface processing related to manufacturing and/or fabrication of substrates, e.g., semiconductor chips and related applications including e.g., chip and/or substrate repair. The invention encompasses selective deposition of materials, as described herein, e.g., as layers and films (e.g., barrier films on silicon wafer or semiconductor chip surfaces for manufacturing) for filling (completely or partially) and coating surfaces (completely or partially) and/or other complex surfaces, including, but not limited to, voids (e.g., three-dimensional voids), tunnels (e.g., interconnected tunnels) and/or other structures (nano- and micro-structures) having otherwise complex geometries (e.g., dual damascene structures, including portions thereof. Selective deposition may be used in conjunction with, or as an alternative to, processes including, but not limited to, Chemical Mechanical Planarization (CMP). No limitations are hereby intended.

While the present invention has been described herein with reference to various embodiments thereof, it should be understood that the invention is not limited thereto, and various alternatives in form and detail may be made therein without departing from the spirit and scope of the invention.

We claim:

1. A method for selective deposition of a deposition material to a deposition surface, comprising the steps of:
   providing a substrate, said substrate including a deposition surface disposed in an operable thermal relationship with at least one heating source;
   applying a solvent containing a precursor upon said deposition surface, said precursor miscible in and stable at liquid, near-critical, or supercritical conditions for said solvent, said precursor comprising a deposition material releasable at a preselected release temperature or condition;
   heating said substrate with said at least one heating source to generate a temperature gradient along said deposition surface;
   whereby said deposition material is released from said precursor and selectively deposited upon said surface in response to said temperature gradient thereby controlling the location and quantity of said deposition material deposited upon said deposition surface.

2. The method of claim 1, wherein said substrate is a semiconductor chip or wafer.

3. The method of claim 1, wherein said deposition surface is positioned in a location selected from the group consisting of: upon the substrate, beneath the substrate, within the substrate, without the substrate, and combinations thereof.

4. The method of claim 1, wherein said deposition surface comprises a member selected from the group consisting of void(s), tunnel(s), interconnected tunnel(s), micro-structure(s), pattern feature(s), nano-structure(s), and combinations thereof.

5. The method of claim 4, wherein said micro- and/or nano-structures are selected from the group consisting of mechanical device(s), fan(s), cantilever(s), advanced mems device(s), damascene structure(s).

6. The method of claim 1, wherein said solvent comprises at least one member selected from the group consisting of carbon dioxide, ethane, ethylene, propane, butane, sulfurhexafluoride, ammonia, and combinations thereof.

7. The method of claim 1, wherein said at least one heating source is selected from the group consisting of infra-red, convective, resistive, ultrasonic, mechanical, chemical, and combinations thereof.

8. The method of claim 1, wherein said precursor is a compound selected from the group consisting of thermal polymerizing polymers, grafting polymers, metal chelates, metal carbonyls, transition metal coupling agents, diketonates, complexing agents, organometallic compound reagents, and combinations thereof.

9. The method of claim 1, wherein said precursor is a metal carbonyl compound.

10. The method of claim 1, wherein said precursor is an organometallic compound.

11. The method of claim 1, wherein said precursor is selected from the group consisting of: copper (I) hexafluoracetylacetonate, copper(I) hexafluoroacetylacetonate-2-methyl-1-hexene-3-yne, copper (I) hexafluoracetylacetonate-2-butyne, copper (I) hexafiuoracetylacetonate(cod), Cu(I) hexafluoroacetylacetonate-vinyl-trimethylsilane, Cu(II) hexafluoroacetonate, Cu(II)hexafluoroacetylacetonate-vinyl-trimethylsilane, Cu (I) hexafluoropentanedionate-vinyltrimethylsilane complex, Cu(II) hexafluoropentanedionate-vinyltrimethylsilane complex, Cu(I) hexafluoropentanedionate cyclooctadiene complex, Cu (II) hexafluoro-2,4-pentanedionate, copper (I) hexafluoracetylacetonate-trimethylvinylsilane, trirutheniumdodecacarbonyl, ruthenocene, and combinations thereof.

12. The method of claim 1, wherein said deposition surface comprises a material defect repairable in accordance with said method.

13. The method of claim 1, wherein said release condition comprises a member selected from the group consisting of pressure, kinetics, catalysis, reaction rates, thermodynamic rates, decomposition, and combinations thereof.

14. The method of claim 1, wherein said deposition material is a metal.

15. The method of claim 14, wherein said metal is selected from the group consisting of Cu, Ru, Zn, Ni, Al, W, Ti, and Ta.

16. The method of claim 1, wherein said deposition material is a nonmetal.

17. The method of claim 1, wherein said deposition material is a polymer.

18. The method of claim 17, wherein said polymer is selected from the group consisting of thermal polymers, grafting polymers, and combinations thereof.

19. The method of claim 1, wherein said temperature gradient comprises two-dimensional or three-dimensional temperature gradient(s) for controlling deposition selectively to said surface.

20. The method of claim 1, wherein said temperature gradient is generated in conjunction with temperature programming.

21. The method of claim 1, further comprising introducing at least one chemical additive or reagent to said solvent selected from the group consisting of reducing agents, oxidizing agents, catalytic agents, reactive chemical agents, non-reactive chemical agents, co-solvents, and combinations thereof.

22. The method of claim 21, wherein said reducing agent(s) is hydrogen present at near or stoichiometric excess in said solvent fluid.

23. The method of claim 21, wherein said co-solvents are selected from the group consisting of alcohols, ketones.

24. The method of claim 23, wherein said alcohols are selected from the group consisting of methanol and ethanol.

25. The method of claim 23, wherein said ketone is acetone.

26. A method for selective deposition to a feature surface or deposition surface, comprising:
   providing a substrate or material having feature patterns and/or a deposition surface disposed in an operable thermal relationship with a heat source(s);
   providing a precursor comprising a deposition material releasable at a release temperature or condition for said precursor;
   exposing said substrate to a solvent that contains said precursor at liquid, near-critical, or supercritical conditions for said solvent;
   heating said substrate with said source(s) generating a temperature gradient in said feature patterns; and
   whereby said deposition material is released from said precursor at said release temperature or condition and selectively deposited in said feature patterns and/or to said deposition surface in response to said temperature gradient filling said feature patterns or a portion thereof and controlling the location of said deposition material in said feature patterns and/or to said deposition surface.

27. The method of claim 26, wherein said substrate is a semiconductor wafer or chip.

28. The method of claim 26, wherein said deposition surface and/or feature surface comprises a surface selected from the group consisting of two-dimensional, three-dimensional, bottom, flat, horizontal, vertical, and combinations thereof.

29. The method of claim 26, wherein said features are selected from the group consisting of vias, wells, trenches, gaps, holes, divots and combinations thereof.

30. The method of claim 29, wherein said vias have a lateral dimension in the range from about 250 nm to about 1 μm and depths in the range from about 200 nm to about 400 nm.

31. The method of claim 26, wherein said features have aspect ratios in the range from about 2 to about 100.

32. The method of claim 26, wherein said deposition surface comprises a material defect repairable by said method.

33. The method of claim 26, wherein said deposition surface comprises a member selected from the group consisting of void(s), tunnel(s), interconnected tunnel(s), micro-structure(s), nano-structure(s), or combinations thereof having a three-dimensional surface.

34. The method of claim 33, wherein said micro- and/or nano-structures are selected from the group consisting of mechanical device(s), fan(s), cantilever(s), mems device(s), damascene structure(s).

35. The method of claim 26, wherein said release condition comprises a member selected from the group consisting of pressure, kinetics, catalysis, reaction rates, thermodynamic rates, thermal decomposition, and combinations thereof.

36. The method of claim 26, wherein said filling comprises depositing material released from said precursor along said temperature gradient in said feature.

37. The method of claim 26, wherein said filling comprises a member selected from the group consisting of partial, complete, asymmetric, conformal.

38. The method of claim 26, wherein said selective deposition comprises asymmetrically filling of said features.

39. The method of claim 26, wherein said selective deposition comprises coating the internal surfaces of said features.

40. The method of claim 26, wherein said temperature gradient comprises a two-dimensional temperature gradient or three dimensional gradient for controlling deposition selectively to said surface.

41. The method of claim 26, wherein said temperature gradient is generated in conjunction with temperature programming.

42. The method of claim 26, wherein said solvent is selected from the group consisting of carbon dioxide, ethane, ethylene, propane, butane, sulfurhexafluoride, ammonia, and combinations thereof.

43. The method of claim 26, wherein said solvent further comprises at least one reagent selected from the group consisting of reducing agents, oxidizing agents, hydrogen, alcohols, ketones, and combinations thereof.

44. The method of claim 43, wherein said alcohols are selected from the group consisting of methanol and ethanol.

45. The method of claim 43, wherein said ketone is acetone.

46. The method of claim 26, wherein said deposition material is a nonmetal.

47. The method of claim 26, wherein said deposition material is a polymer.

48. The method of claim 47, wherein said polymer is selected from the group consisting of thermal polymers, grafting polymers, and combinations thereof.

49. The method of claim 26, wherein said precursor is a metal carbonyl compound.

50. The method of claim 26, wherein said precursor is an organometallic compound.

51. The method of claim 26, wherein said precursor is selected from the group consisting of: copper (I) hexafluoracetylacetonate, copper(I) hexafluoroacetylacetonate-2-methyl-1-hexene-3-yne, copper (I) hexafluoracetylacetonate-2-butyne, copper (I) hexafluoracetylacetonate(cod), Cu(I)hexafluoroacetylacetonate-vinyl-trimethylsilane, Cu(II) hexafluoroacetonate, Cu(II)hexafluoroacetylacetonate-vinyl-trimethylsilane, Cu (I) hexafluoropentanedionate-vinyltrimethylsilane complex, Cu(II) hexafluoropentanedionate-vinyltrimethylsilane complex, Cu(I) hexafluoropentanedionate cyclooctadiene complex, Cu (II) hexafluoro-2,4-pentanedionate, copper (I) hexafluoracetylacetonate-trimethylvinylsilane, trirutheniumdodecacarbonyl, ruthenocene, and combinations thereof.

52. The method of claim 26, wherein said deposition material is a metal.

53. The method of claim 52, wherein said metal is selected from the group consisting of Cu, Ru, Zn, Ni, Al, W, Ti, Ta.

54. The method of claim 26, wherein said precursor comprises a deposition material operable as a barrier cap layer for a semiconductor substrate.

* * * * *